United States Patent
Mochizuki et al.

(10) Patent No.: US 10,541,331 B2
(45) Date of Patent: Jan. 21, 2020

(54) FABRICATION OF A VERTICAL FIN FIELD EFFECT TRANSISTOR WITH AN ASYMMETRIC GATE STRUCTURE

(71) Applicant: INTERNATIONAL BUSINESS MACHINES CORPORATION, Armonk, NY (US)

(72) Inventors: Shogo Mochizuki, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/123,665

(22) Filed: Sep. 6, 2018

(65) Prior Publication Data

US 2019/0019889 A1    Jan. 17, 2019

Related U.S. Application Data

(63) Continuation of application No. 15/195,498, filed on Jun. 28, 2016, now Pat. No. 10,217,863.

(51) Int. Cl.
*H01L 29/78* (2006.01)
*H01L 29/66* (2006.01)
*H01L 29/49* (2006.01)
*H01L 29/08* (2006.01)
*H01L 29/51* (2006.01)

(52) U.S. Cl.
CPC ...... *H01L 29/7827* (2013.01); *H01L 29/0847* (2013.01); *H01L 29/495* (2013.01); *H01L 29/66484* (2013.01); *H01L 29/66666* (2013.01); *H01L 29/7831* (2013.01); *H01L 29/4966* (2013.01); *H01L 29/517* (2013.01); *H01L 29/66545* (2013.01)

(58) Field of Classification Search
None
See application file for complete search history.

(56) References Cited

U.S. PATENT DOCUMENTS

| | | |
|---|---|---|
| 5,128,272 A | 7/1992 | Ramde |
| 5,326,711 A | 7/1994 | Malhi |
| 5,480,838 A | 1/1996 | Mitsui |

(Continued)

FOREIGN PATENT DOCUMENTS

| | | |
|---|---|---|
| CA | 1271266 | 7/1990 |
| WO | WO02086904 | 10/2002 |

(Continued)

OTHER PUBLICATIONS

List of IBM Patents or Patent Applications Treated as Related dated Sep. 6, 2018, 2 pages.

*Primary Examiner* — Cory W Eskridge
(74) *Attorney, Agent, or Firm* — Tutunjian & Bitetto, P.C.; Vazken Alexanian

(57) ABSTRACT

A method of forming a vertical fin field effect transistor (vertical finFET) with two concentric gate structures, including forming one or more tubular vertical fins on a substrate, forming a first gate structure around an outer wall of at least one of the one or more tubular vertical fins, and forming a second gate structure within an inner wall of at least one of the one or more tubular vertical fins having the first gate structure around the outer wall.

20 Claims, 16 Drawing Sheets

(56) References Cited

U.S. PATENT DOCUMENTS

| | | | |
|---|---|---|---|
| 6,104,061 A | 8/2000 | Forbes et al. | |
| 6,150,210 A | 11/2000 | Arnold | |
| 6,194,773 B1 | 2/2001 | Malhi | |
| 6,492,212 B1 | 12/2002 | Ieong et al. | |
| 7,560,728 B2 | 7/2009 | Lin et al. | |
| 7,592,218 B2 | 9/2009 | Brown | |
| 7,791,068 B2 | 9/2010 | Meng et al. | |
| 7,910,413 B2 | 3/2011 | Zhu | |
| 7,915,685 B2 | 3/2011 | Cohen | |
| 8,383,477 B2 | 2/2013 | Lee | |
| 8,471,310 B2 | 6/2013 | Hynecek | |
| 9,048,329 B2 | 6/2015 | Kim et al. | |
| 9,224,837 B2 | 12/2015 | Anderson et al. | |
| 2003/0015755 A1 | 1/2003 | Hagemeyer | |
| 2003/0111686 A1* | 6/2003 | Nowak | H01L 29/66795 257/328 |
| 2007/0228471 A1 | 10/2007 | Schuele et al. | |
| 2008/0061316 A1* | 3/2008 | Cohen | H01L 21/823412 257/190 |
| 2008/0197397 A1 | 8/2008 | Parthasarathy et al. | |
| 2011/0006360 A1 | 1/2011 | Ikebuchi | |
| 2012/0214285 A1 | 8/2012 | Guha et al. | |
| 2015/0357337 A1 | 12/2015 | Takaishi | |

FOREIGN PATENT DOCUMENTS

| | | |
|---|---|---|
| WO | WO2005091376 | 9/2005 |
| WO | WO2013123287 | 8/2013 |

\* cited by examiner

FABRICATION OF A VERTICAL FIN FIELD EFFECT TRANSISTOR WITH AN ASYMMETRIC GATE STRUCTURE

BACKGROUND

Technical Field

The present invention generally relates to a vertical fin field effect transistor structure with two separate gates, and more particularly to a vertical fin field effect transistor (vertical finFET) with a channel control gate and a back gate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. A vertical finFET can also be configured with a bottom source/drain in the substrate and a top source/drain on the vertical fin, where the current then flows in a direction perpendicular to the substrate. The channel for the finFET can typically be an upright slab of thin rectangular Si, commonly referred to as the fin with a gate on the fin, as compared to a MOSFET with a gate on the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a vertical fin field effect transistor (vertical finFET) with two concentric gate structures. The method includes the step of forming one or more tubular vertical fins on a substrate, forming a first gate structure around an outer wall of at least one of the one or more tubular vertical fins, and forming a second gate structure within an inner wall of at least one of the one or more tubular vertical fins having the first gate structure around the outer wall.

In accordance with an embodiment of the present principles, a method is provided for forming a vertical fin field effect transistor (vertical finFET) with two concentric gate structures. The method includes the step of forming a plurality of sacrificial mandrels on a substrate and reducing the lateral dimensions of the sacrificial mandrels. The method further includes the step of forming a tubular vertical fin on each of the plurality of sacrificial mandrels. The method further includes the step of forming a first gate structure around an outer wall of at least one of the plurality tubular vertical fins, removing the plurality of sacrificial mandrels, and forming a second gate structure on at least a portion of an inner wall of each tubular vertical fin.

In accordance with another embodiment of the present principles, a vertical fin field effect transistor device with a concentric gate structure is provided. The device includes a tubular vertical fin, a first gate structure formed on at least a portion of the outer wall of the tubular vertical fin, and a second gate structure formed on at least a portion of the inner wall of the tubular vertical fin.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
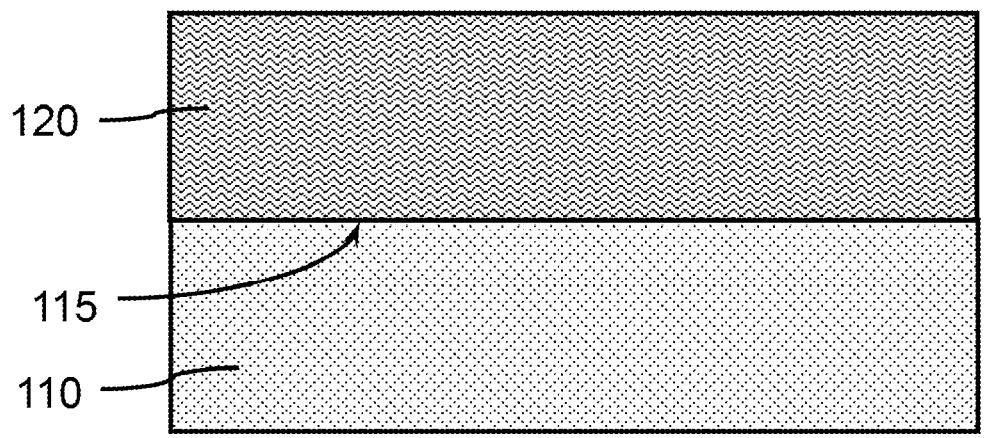
FIG. 1 is a cross-sectional side view of a substrate with a mandrel layer formed on the substrate surface, in accordance with an exemplary embodiment.

Principles and embodiments of the present disclosure relate generally to fabricating two separate gate structures on the same vertical fin to affect broader control of current in the vertical channel of a finFET. A first gate may be configured and used for current control in the channel, while the second gate may be configured and used as a back gate to apply a voltage bias to adjust a threshold voltage of the finFET. In various embodiments, the two separate gate structures may operate independently, where each gate structure may have a separate electrical contact. In various embodiments, the two separate gate structures may be formed on the vertical fins without greatly increasing the complexity of the fabrication process.

Principles and embodiments of the present disclosure relate generally to avoiding formation of a wrap-around gate on a vertical fin by arranging the two gates and the channel concentrically, where a first gate is surrounded by a wall of the fin material and a second gate surrounds the fin wall, such that the second gate is in contact with the outer face of the fin wall and the first gate is in contact with the inner face of the fin wall. A fin wall can have a tubular configuration having two sides but no ends, thereby providing a geometry in which the channel, itself, acts as a barrier that separates asymmetric gate structures, where the current flows perpendicular to the substrate.

Due to the concentric arrangement, two or more vertical fin walls may be surrounded by the same second gate structure. The second gate structure may be partitioned by etching and forming isolation regions between neighboring fins to form different vertical finFETs. The vertical fin(s) may form a plurality of devices each having single or multiple tubular vertical fins, where the gates and/or source/drains may be electrically coupled.

Exemplary applications/uses to which the present principles can be applied include, but are not limited to: formation of vertical finFETs, complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, shows a cross-sectional side view of a substrate with a mandrel layer formed on the substrate surface, in accordance with an exemplary embodiment.

It should be noted that certain features may not be shown in all figures for the sake of clarity. This is not intended to be interpreted as a limitation of any particular embodiment, or illustration, or scope of the claims.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a mandrel layer 120 may be formed on the surface 115 of the substrate 110. The mandrel layer 120 may be epitaxially grown on a crystalline surface of the substrate 110, where the mandrel layer 120 may have the same crystal structure as the underlying substrate. In various embodiments, the mandrel layer 120 may be silicon germanium (SiGe) grown by heteroepitaxy on the surface of a single crystal silicon substrate 110.

Figure 2:
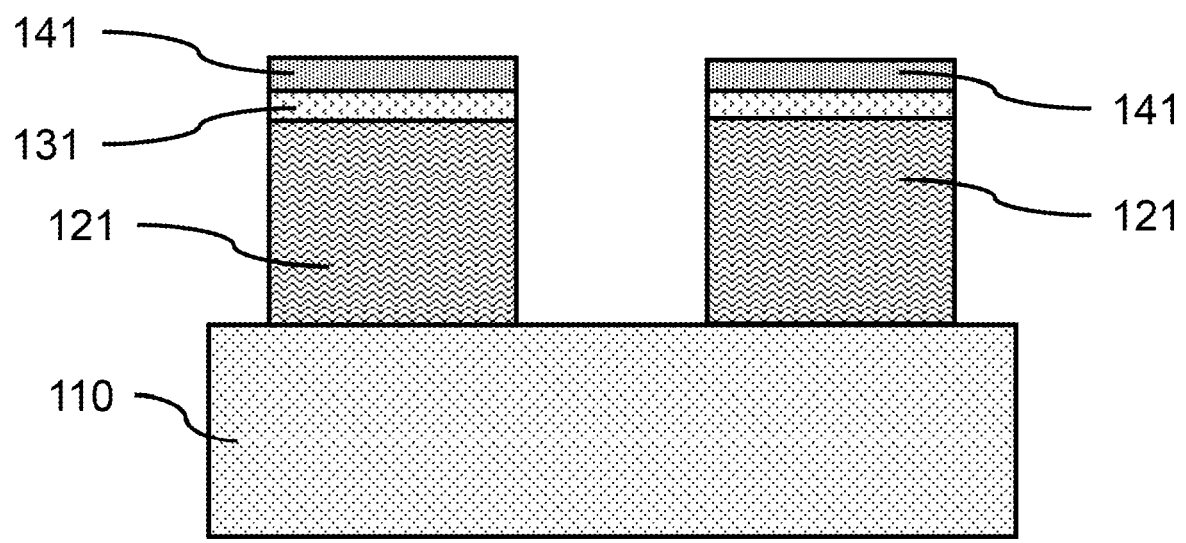
FIG. 2 is a cross-sectional side view of a hardmask layer patterned on a liner layer on a plurality of sacrificial mandrels formed from the mandrel layer, in accordance with an exemplary embodiment.

FIG. 2 is a cross-sectional side view of a hardmask layer patterned on a liner layer on a plurality of sacrificial mandrels formed from the mandrel layer, in accordance with an exemplary embodiment.

In one or more embodiments, a liner layer may be formed on at least a portion of the substrate mandrel layer 120. A hardmask layer may be formed on at least a portion of the liner layer. The liner layer may have a thickness in the range of about 1 nm to about 10 nm, or in the range of about 2 nm to about 5 nm.

In one or more embodiments, a liner layer may be an oxide, for example, silicon oxide (SiO), silicon oxynitride (SiON), or a combination thereof. The liner layer may be deposited or formed by a thermal process, such as, for example, oxidation and/or nitridation of the top portion of the mandrel layer 120. The liner layer may protect the underlying material from having defects introduced by formation of a hardmask layer. The liner layer may be a material different than the hardmask layer, where the liner layer may act as an etch stop layer. In various embodiments, the hardmask layer may be formed directly on the mandrel layer 120 without an intervening liner layer.

In one or more embodiments, a hardmask layer may be formed on an exposed surface of the liner layer. In various embodiments, the hardmask layer may be an oxide, for example, silicon oxide (SiO), a nitride, for example, a silicon nitride (SiN), or an oxynitride, for example, silicon oxynitride (SiON), or a combination thereof. In various embodiments, the hardmask layer may be silicon nitride (SiN), for example, $Si_3N_4$.

In one or more embodiments, the hardmask layer may have a thickness in the range of about 20 nm to about 100 nm, or in the range of about 35 nm to about 75 nm, or in the range of about 45 nm to about 55 nm, although other thicknesses are contemplated.

A photo mask layer may be formed and patterned on the exposed surface of the hardmask layer to form photo mask(s). The photo mask layer may be a temporary resist (e.g., poly methyl methacrylate (PMMA)) that may be deposited on the hardmask layer, patterned, and developed to expose portions of the hardmask layer. The photo mask layer may be a positive resist or a negative resist.

In one or more embodiments, the hardmask layer may be etched to form one or more hardmask slab(s) 141, where the photo mask defines the width, length, and location of the hardmask slab(s) 141 on the mandrel layer 120. In various embodiments, the liner layer may act as an etch stop. The liner layer may be etched to form a liner plate 131 below each hardmask slab 141.

In one or more embodiments, a portion of the mandrel layer 120 may be removed to form one or more sacrificial mandrels 121 on the substrate.

In one or more embodiments, the photo mask(s), liner plate(s) 131, and/or hardmask slab(s) 141 may have a width in the range of about 6 nm to about 20 nm, or may have a width in the range of about 8 nm to about 15 nm, or may have a width in the range of about 10 nm to about 12 nm. The photo mask(s), liner plate(s) 131, and/or hardmask slab(s) 141 may have a length in the range of about 100 nm to about 1000 nm, or in the range of about 100 nm to about 500 nm, or in the range of about 100 nm to about 400 nm, or in the range of about 100 nm to about 200 nm.

In various embodiments, there may be a pitch, Pi, between adjacent hardmask slabs 141 in the range of about 30 nm to about 200 nm, or in the range of about 30 nm to about 100 nm, or in the range of about 30 nm to about 50 nm, or about 42 nm.

In one or more embodiments, portions of the mandrel layer 120 may be removed by an isotropic etch or an anisotropic etch. An anisotropic etch may be a directional dry plasma etch that preferentially removes material from exposed surfaces approximately perpendicular to the incident direction of the plasma. The dry plasma etch may be a reactive ion etch (RIE). An isotropic etch may be a wet chemical etch that removes material from exposed surfaces approximately uniformly depending on the selectivity of the wet chemical etchant. In one or more embodiments, an RIE may be used to form one or more mandrel trenches to separate the mandrel layer into a plurality of sacrificial mandrels 121.

Figure 3:
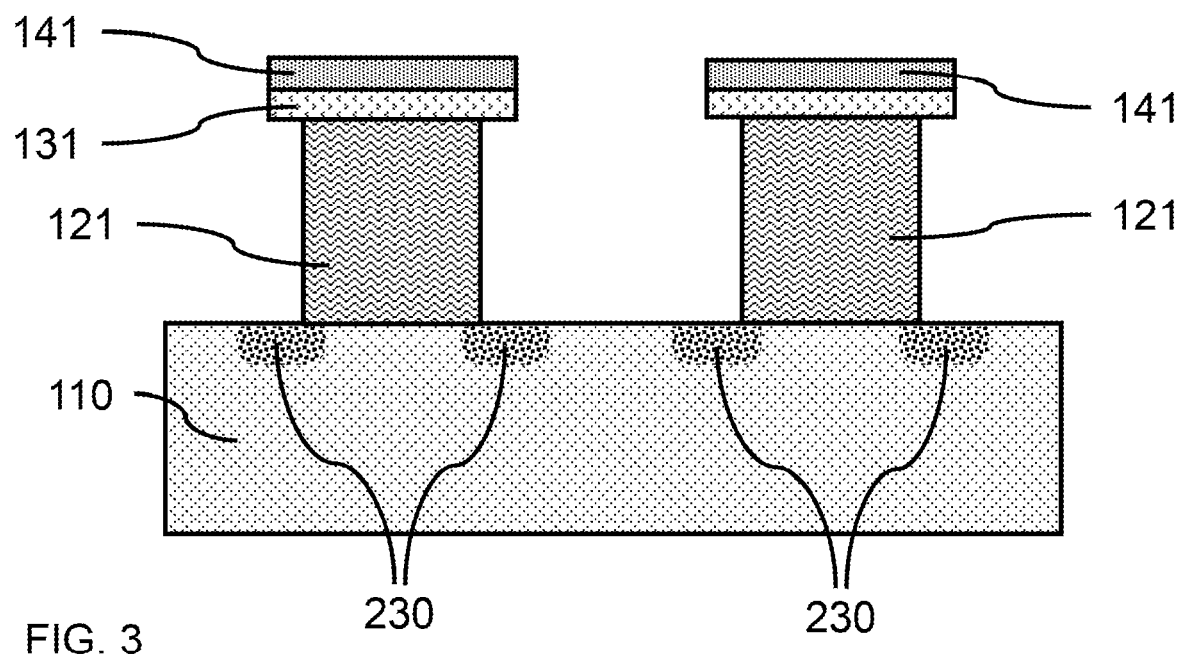
FIG. 3 is a cross-sectional side view of a hardmask slab and liner plate on each of a plurality of laterally reduced sacrificial mandrels on a substrate, in accordance with an exemplary embodiment.

FIG. 3 is a cross-sectional side view of a hardmask slab and liner plate on each of a plurality of laterally reduced sacrificial mandrels on a substrate, in accordance with an exemplary embodiment.

In one or more embodiments, a portion of the sacrificial mandrel(s) 121 may be removed, where the removed portion may be from the sidewall of the sacrificial mandrel(s) 121 to reduce the lateral dimensions of the sacrificial mandrel(s) 121.

In various embodiments, a portion of the sacrificial mandrel sidewalls may be removed by an oxidation and etching process, where a portion of the sacrificial mandrel 121 is converted to a thermal oxide and removed by a hydrofluoric acid (HF) wet etch. In various embodiments, a portion of the sacrificial mandrel sidewalls may be removed directly by a selective isotropic wet etch that preferentially removes the material of the sacrificial mandrel(s) 121, while minimizing or avoiding etching of the substrate surface 115, liner plate(s) 131, and hardmask slab(s) 141. The sacrificial mandrel(s) 121 may have a smaller lateral dimensions (i.e., width, length) than the liner plate(s) 131, and/or hardmask slab(s) 141 after removal of the mandrel/oxide material.

In a non-limiting example, a SiGe sacrificial mandrel 121 may be exposed to an oxidizing atmosphere that reacts with the Si of the sacrificial mandrel 121 to form a layer of silicon oxide on the perimeter of the sacrificial mandrel 121. The layer of silicon oxide on the perimeter of the sacrificial mandrel 121 may then be removed by a HF wet etch leaving a sacrificial mandrel 121 with a reduced width and length (i.e., lateral dimensions).

In one or more embodiments, a doped region 230 may be formed in the substrate 110. The doped region may be formed in-situ or ex-situ below the vertical fin(s) 151. One or more doped regions 230 may be formed in the substrate above which each of the one or more vertical fins may be formed. The dopant may be provided to the doped region(s) 230 by ion implantation, and source/drains formed by annealing the doped region(s). In various embodiments, the doped region 230 (i.e., source/drain region) may be n-doped or p-doped. The doped region 230 may form a bottom source/drain of a vertical fin field effect transistor (vertical finFET). In various embodiments, a plurality of vertical fins 111 may be electrically coupled to the same bottom source/drain to form a multi-fin vertical FET. The vertical fin(s) and bottom source/drain(s) may be suitably doped to form an NFET or a PFET.

Figure 4:
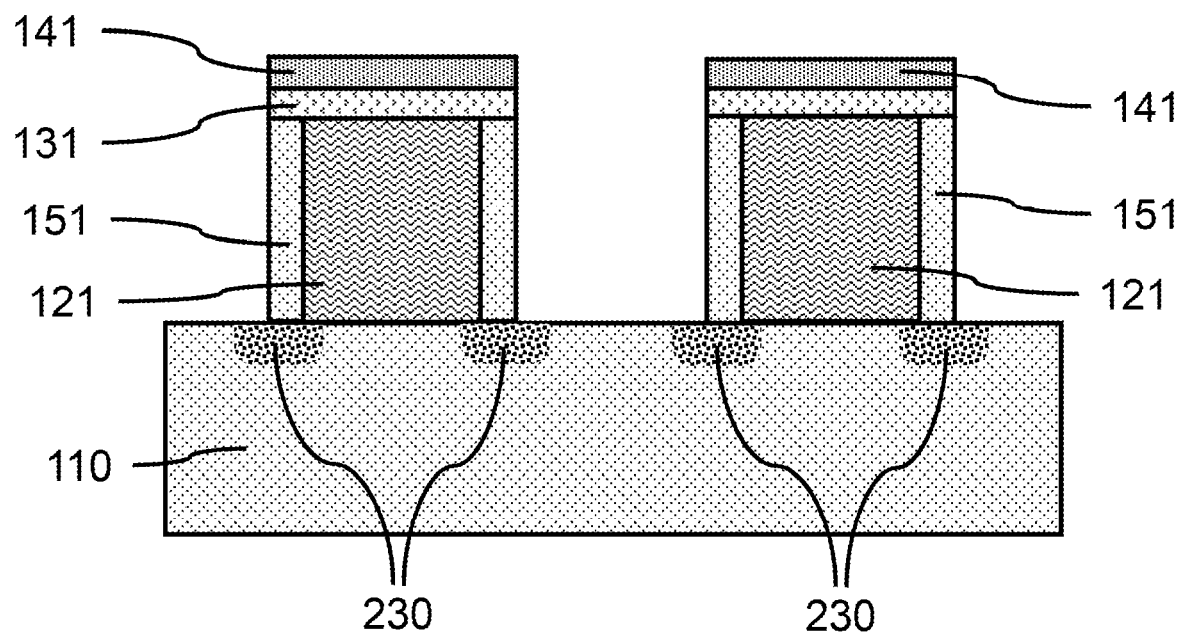
FIG. 4 is a cross-sectional side view of a vertical fin formed on each of the sacrificial mandrels, in accordance with an exemplary embodiment.

FIG. 4 is a cross-sectional side view of a vertical fin formed on each of the sacrificial mandrels, in accordance with an exemplary embodiment.

In one or more embodiments, a vertical fin 151 may be formed on each sacrificial mandrel 121. The vertical fin 151 may be formed on the sacrificial mandrel 121 by a heteroepitaxial growth process, where the vertical fin 151 is crystalline and has the same crystal orientation and structure as the underlying substrate surface and sidewall surface of the sacrificial mandrel. In a non-limiting embodiment, a crystalline silicon vertical fin 151 may be grown on a single crystal silicon substrate and a SiGe sacrificial mandrel. In various embodiments, the vertical fin(s) 151 may be suitably doped to form channels of a vertical finFET, where the vertical fin may be doped in-situ or ex-situ.

Figure 5:
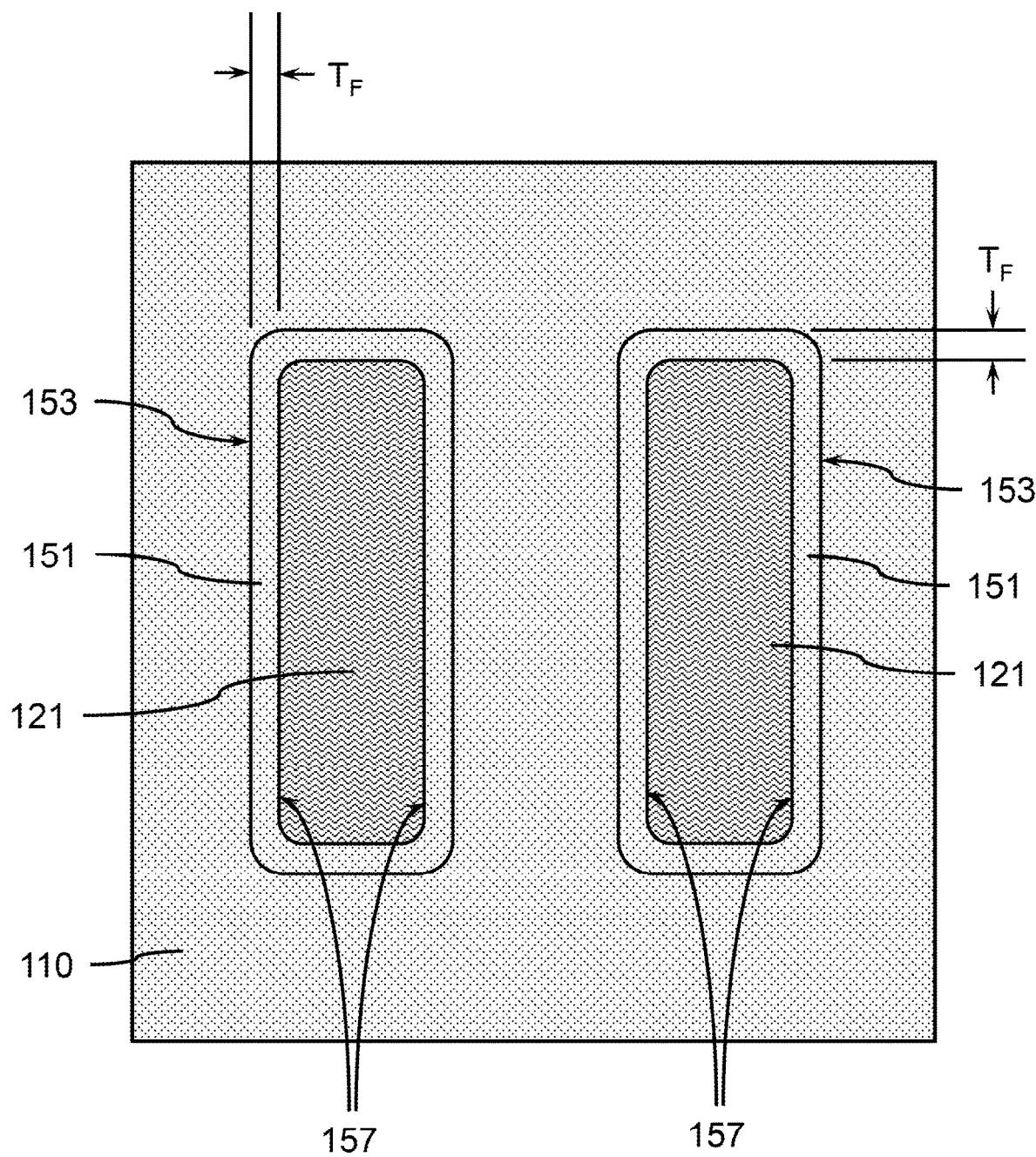
FIG. 5 is a cross-sectional top view of a vertical fin formed on a sacrificial mandrel on the substrate, in accordance with an exemplary embodiment.

FIG. 5 is a cross-sectional top view of a vertical fin formed on a sacrificial mandrel on the substrate, in accordance with an exemplary embodiment.

In one or more embodiments, the vertical fin 151 may have an annular shape that surrounds the sacrificial mandrel 121, where the sacrificial mandrel may be rectangular, circular, oval, oblong, elliptical, etc., and where the vertical fin 151 has a thickness in the lateral direction In various embodiments, the channel of a vertical finFET may be configured as a tube having an outer wall 153, an inner wall 157, each with a height, and a wall thickness, $T_F$, therebetween. The vertical fin 151 may be in direct contact with the outer surface of the sacrificial mandrel 121.

In various embodiments, the vertical fin(s) 151 may have a thickness, $T_F$, in the range of about 6 nm to about 20 nm, or may have a width in the range of about 8 nm to about 15 nm, or in the range of about 10 nm to about 12 nm.

Figure 6:
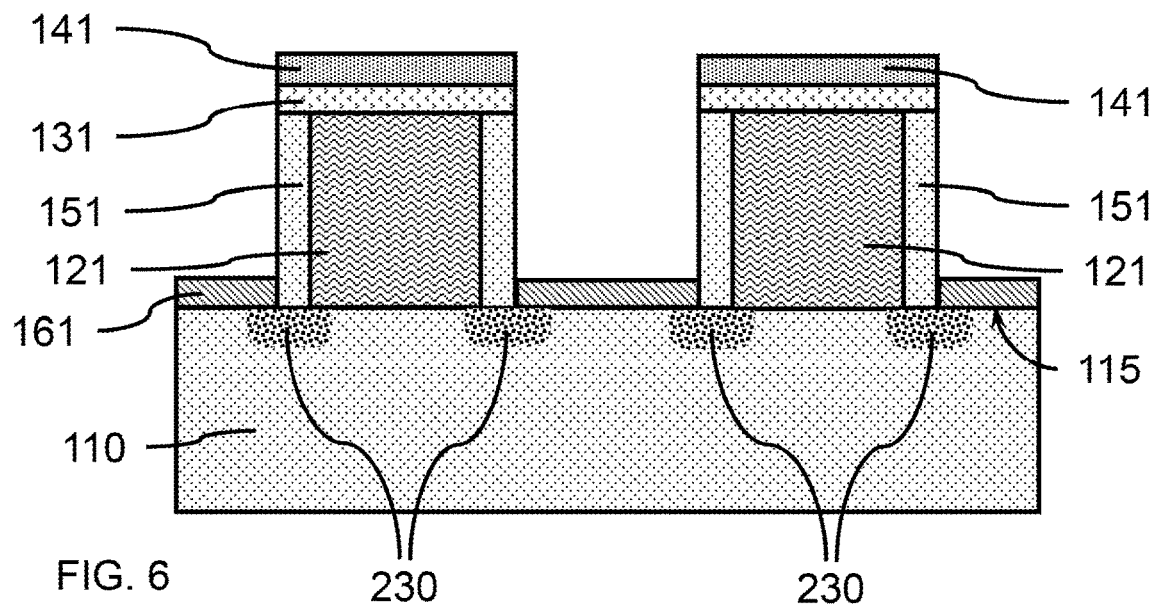
FIG. 6 is a cross-sectional side view of a bottom spacer formed around each vertical fin on the sacrificial mandrels, in accordance with an exemplary embodiment.

FIG. 6 is a cross-sectional side view of a bottom spacer formed around each vertical fin on the sacrificial mandrels, in accordance with an exemplary embodiment.

In one or more embodiments, a bottom spacer 161 may be formed on the surface 115 of the substrate 110, where the bottom spacer may be formed in the region(s) between each vertical fin 151 on a sacrificial mandrel. The bottom spacer may surround at least one vertical fin 151. In various embodiments, the bottom spacer 161 may be formed by a blanket deposition over the hardmask slab(s) 141 and substrate surface 115, and etched back to leave the bottom spacers 161. The bottom spacers 161 also may be formed by a directional deposition, for example, a gas cluster ion beam (GCIB) deposition process that preferentially forms the bottom layer on the surfaces approximately normal to the direction of the ion beam. Portions of the bottom spacer 161 may be removed from the hardmask slab(s) 141 and/or sidewalls of the vertical fin(s) 151, for example, by masking and etching to leave a bottom spacers 161 on the exposed portions of the substrate surface 115 adjacent to the lower portion(s) of the vertical fin(s) 151. The bottom spacer 161 may be referred to as a first bottom spacer.

In one or more embodiments, the first bottom spacer 161 may have a thickness in the range of about 3 nm to about 25 nm, or in the range of about 5 nm to about 20 nm. The thickness of the first bottom spacer 161 may provide electrical isolation of subsequently formed work function layer(s) and/or a conducting gate fill layer from a doped region 230 in the substrate 110.

Figure 7:
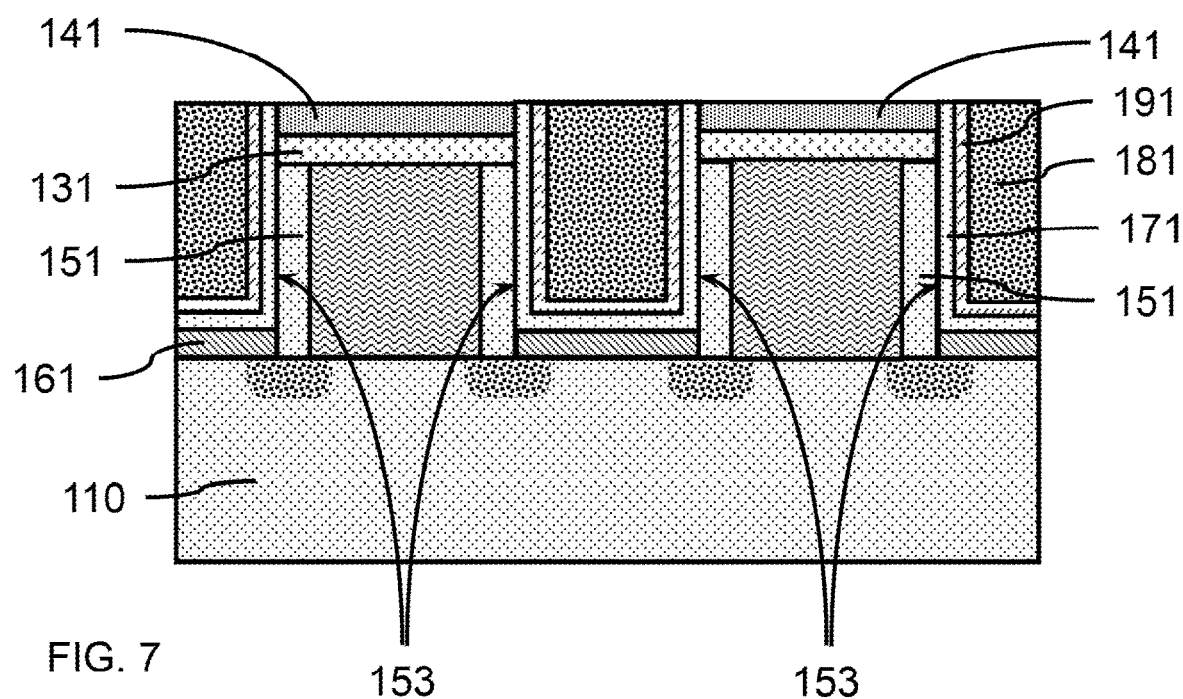
FIG. 7 is a cross-sectional side view of a gate structure formed on a bottom spacer around a plurality of vertical fins, in accordance with an exemplary embodiment.

FIG. 7 is a cross-sectional side view of a gate structure formed on a bottom spacer around a plurality of vertical fins, in accordance with an exemplary embodiment.

In one or more embodiments, a gate structure may be formed on at least a portion of an outer wall 153 of a vertical fin 151, where the outer wall may be a vertical sidewall of a tubular vertical fin 151. A gate structure may include one or more material layers that insulate a conductive gate electrode from a vertical fin forming a channel.

In one or more embodiments, a gate dielectric layer 171 may be formed on at least a portion of a vertical fin 151, where the gate dielectric layer 171 may be formed on the outer wall 153 of a vertical fin 151. The gate dielectric layer 171 may be formed on at least a portion of a first bottom spacer 161. The gate dielectric layer 171 may be referred to a first gate dielectric layer.

In various embodiments, the gate dielectric layer 171 may be an insulating dielectric material, for example, silicon oxide (SiO) or a high-k dielectric material.

In various embodiments, the gate dielectric layer 171 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-k dielectric compounds may vary.

In one or more embodiments, a gate structure may include a gate fill layer 181, In one or more embodiments, a gate fill layer 181 may be formed on the first bottom spacer 161 and/or first gate dielectric layer 171, where the gate fill layer 181 may be a conductive material that forms part of a gate electrode on a vertical fin 151. In various embodiments, the gate fill layer 181 may be formed on the first bottom spacer 161 and/or a work function layer 191. The gate fill layer 181 may be formed by a blanket deposition that fills the spaces between the vertical fins 151, for example, by ALD, CVD, PVD, or a combination thereof. The gate fill layer 181 may extend above the tops surfaces of the vertical fin(s) 151. The portion of gate fill layer 181 above the top surfaces of the vertical fin(s) 151 may be removed, for example, by chemical-mechanical polishing (CMP).

In various embodiments, the conductive gate fill layer 181 may be a metal, where the metal may be tungsten (W), titanium (Ti), molybdenum (Mo), cobalt (Co), or a combination thereof.

In one or more embodiments, a work function layer 191 may be formed between the gate dielectric layer 171 and the gate fill layer 181. A work function layer 191 may be deposited over the gate dielectric layer 171. The work function layer 191 may form part of a gate structure, where the gate structure may be on at least a portion of a vertical fin 151.

In various embodiments, a work function layer 191 may be formed on the gate dielectric layer 171 by a blanket deposition, for example, CVD, and etched back.

In various embodiments, the work function layer 191 may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof.

In various embodiments, the work function layer 191 may have a thickness in the range of about 3 nm to about 11 nm, or may have a thickness in the range of about 5 nm to about 8 nm.

In one or more embodiments, a portion of the first gate fill layer 181, first gate dielectric layer 171, and/or first work function layer 191 may be removed to reduce the height of the first gate fill layer 181, first gate dielectric layer 171, and/or first work function layer 191. In various embodiments, the first gate fill layer 181, first gate dielectric layer 171, and/or first work function layer 191 may be removed by a chemical-mechanical polishing (CMP). The height may be reduced to the top surface of the hardmask slab(s) 141.

Figure 8:
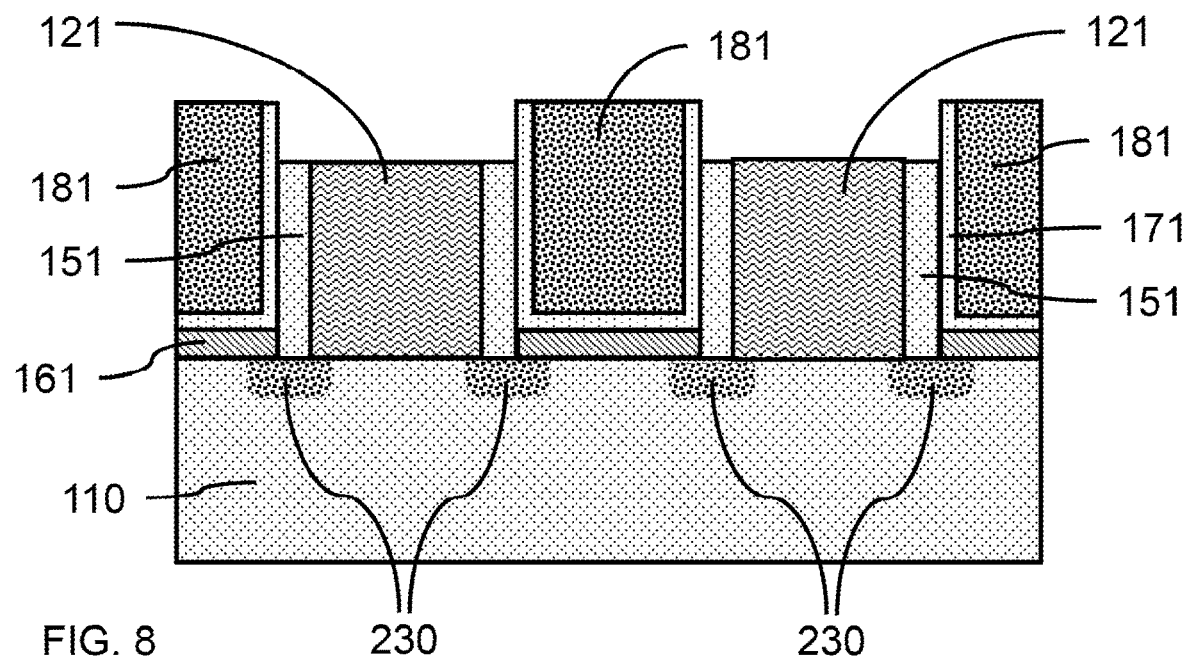
FIG. 8 is a cross-sectional side view of a gate structure formed on a plurality of vertical fins, in accordance with an exemplary embodiment.

FIG. 8 is a cross-sectional side view of a gate structure formed on a plurality of vertical fins, in accordance with an exemplary embodiment.

In one or more embodiments, the hardmask slab(s) 141 and/or liner plate(s) 131 may be removed to expose the underlying sacrificial mandrel 121 and vertical fin(s) 151. The hardmask slab(s) 141 and/or liner plate(s) 131 may be removed by an anisotropic etch, for example, a dry plasma etch, or an isotropic etch, for example, a selective wet etch, where the gate dielectric layer 171, work function layer 191, and the gate fill layer 181 may be masked prior to the etch and removed after the etch.

Figure 9:
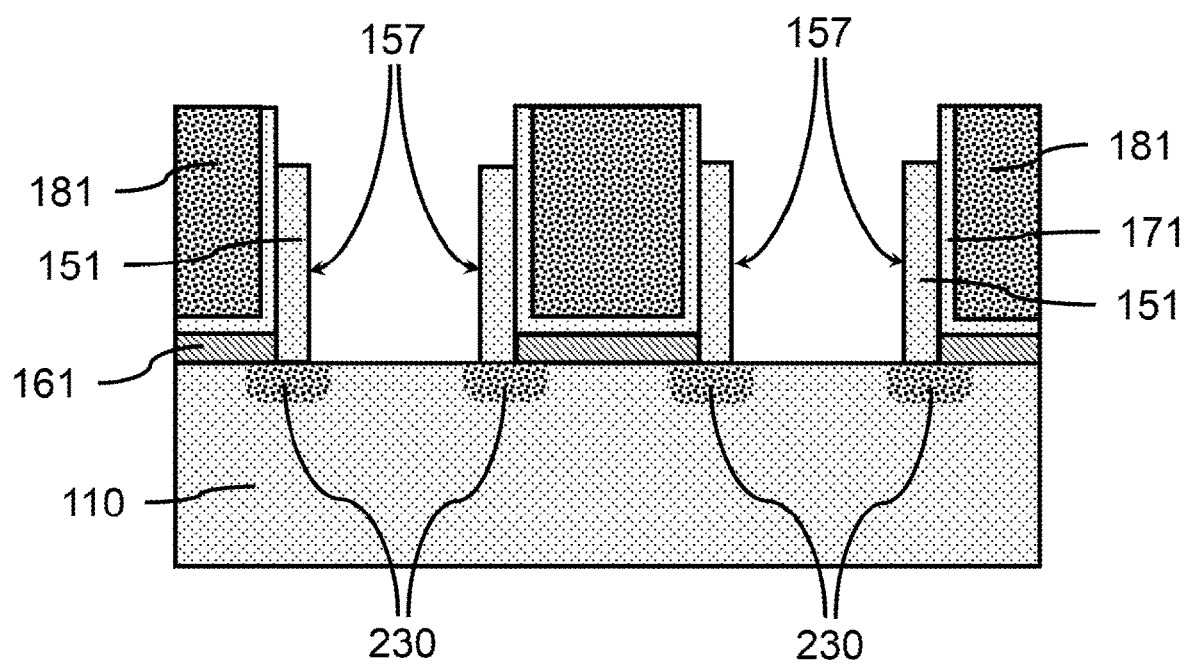
FIG. 9 is a cross-sectional side view of a plurality of vertical fins after removal of the sacrificial mandrels, in accordance with an exemplary embodiment.

FIG. 9 is a cross-sectional side view of a plurality of vertical fins after removal of the sacrificial mandrels, in accordance with an exemplary embodiment.

In one or more embodiments, a sacrificial mandrel 121 may be removed from within a tubular vertical fin 151, where removal of the sacrificial mandrel 121 forms an open space within the tubular vertical fin 151 and exposes the inner wall 157 of the vertical fin 151. In various embodiments, the sacrificial mandrel(s) 121 may be removed using a selective wet etch, RIE, or a combination thereof.

Figure 10:
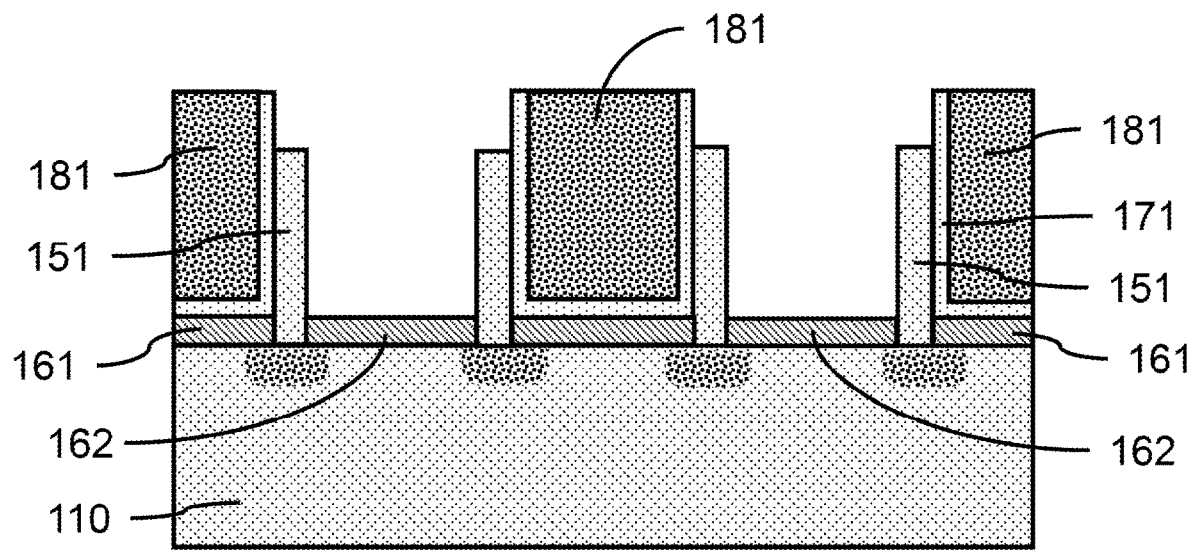
FIG. 10 is a cross-sectional side view of a second bottom spacer formed within the tubular vertical fins after removal of the sacrificial mandrels, in accordance with an exemplary embodiment.

FIG. 10 is a cross-sectional side view of a second bottom spacer formed within the tubular vertical fins after removal of the sacrificial mandrels, in accordance with an exemplary embodiment.

In one or more embodiments, a second bottom spacer 162 may be formed with the confines of a tubular vertical fin 151, where the second bottom spacer 162 may be formed on the surface of the substrate 110 and on a portion of the vertical fin 151. The second bottom spacer 162 may be formed preferentially on the substrate surface by a directional deposition, for example, PVD or GCIB. Material of the second bottom spacer 162 may be etched back and/or selectively removed from the inner wall 157 of the vertical fin 151. The bottom spacers 161, 162 may be over a doped portion of the substrate.

In one or more embodiments, the second bottom spacer(s) 162 may have a thickness in the range of about 3 nm to about 25 nm, or in the range of about 5 nm to about 20 nm. The thickness of the second bottom spacer 162 may provide electrical isolation of subsequently formed work function layer(s) and/or a conducting gate fill layer from a doped region 230 in the substrate 110.

Figure 11:
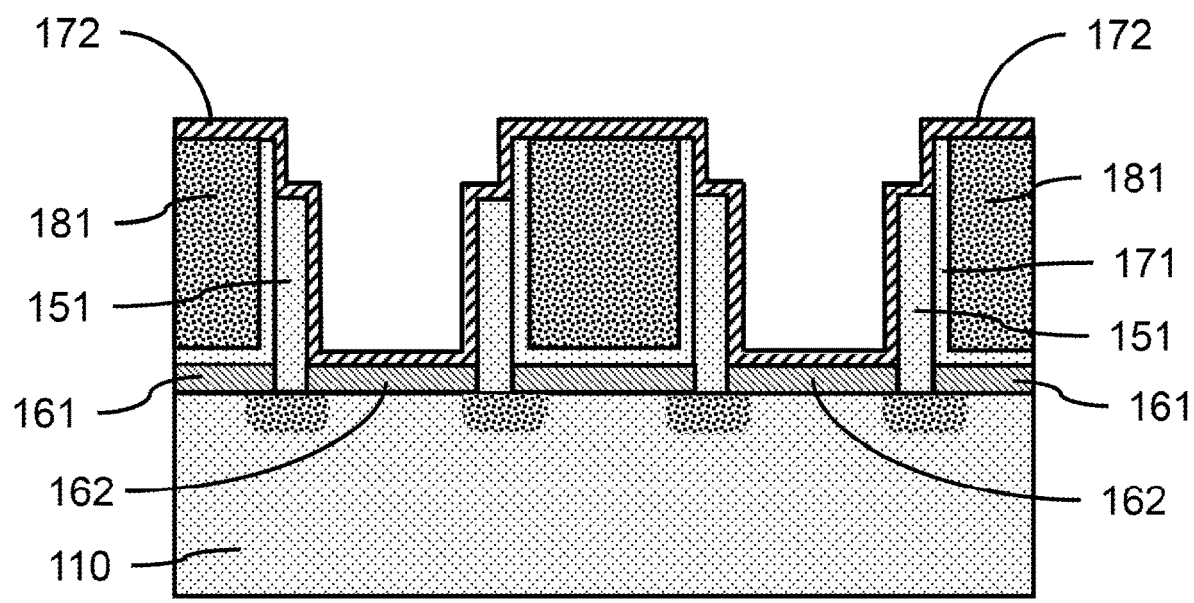
FIG. 11 is a cross-sectional side view of the second bottom spacer formed within the tubular vertical fins and a second gate dielectric layer on the second bottom spacer and inner walls of the tubular vertical fins, in accordance with an exemplary embodiment.

FIG. 11 is a cross-sectional side view of the second bottom spacer formed within the tubular vertical fins and a second gate dielectric layer on the second bottom spacer and inner walls of the tubular vertical fins, in accordance with an exemplary embodiment.

In one or more embodiments, a second gate structure may be formed on at least a portion of an inner wall 157 of a vertical fin 151, where the inner wall may be a vertical sidewall of a tubular vertical fin 151 opposite the outer wall 153. A gate structure may include one or more material layers that insulate a conductive gate electrode from a vertical fin forming a channel.

In one or more embodiments, a second gate dielectric layer 172 may be formed on at least a portion of a vertical fin 151, where the second gate dielectric layer 172 may be formed on the inner wall 157 of a vertical fin 151. The gate dielectric layer 172 may be formed on at least a portion of a second bottom spacer 162.

In various embodiments, the second gate dielectric layer 172 may be an insulating dielectric material, for example, silicon oxide (SiO) or a high-k dielectric material.

In various embodiments, the second gate dielectric layer 172 may be a high-K dielectric material that may include, but is not limited to, metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-k dielectric compounds may vary. In various embodiments, the second gate dielectric layer 172 may be the same material or a different material than the first gate dielectric layer 171.

Figure 12:
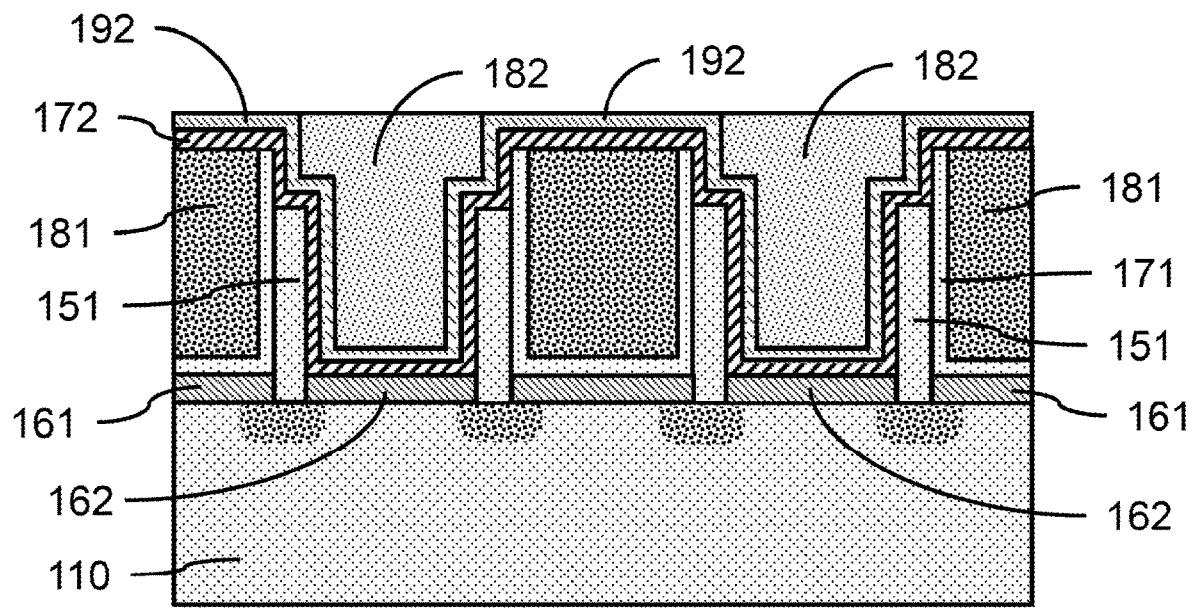
FIG. 12 is a cross-sectional side view of the gate dielectric layer on the second bottom spacer and inner walls of the tubular vertical fins and a gate fill layer to form a second gate structure, in accordance with an exemplary embodiment.

FIG. 12 is a cross-sectional side view of the gate dielectric layer on the second bottom spacer and inner walls of the tubular vertical fins and a gate fill layer to form a second gate structure, in accordance with an exemplary embodiment.

In one or more embodiments, a second gate structure may include a second gate fill layer 182. In one or more embodiments, a second gate fill layer 182 may be formed on the second bottom spacer 162 and/or second gate dielectric layer 172, where the second gate fill layer 182 may be a conductive material that forms part of a gate electrode on a vertical fin 151. In various embodiments, the gate fill layer 182 may be formed on the bottom spacer 162 and/or a work function layer 192. The second gate fill layer 182 may be formed by a blanket deposition that fills the spaces within tubular vertical fin(s) 151, for example, by ALD, CVD, PVD, or a combination thereof. The second gate fill layer 182 may extend above the tops surfaces of the vertical fin(s) 151. The portion of gate fill layer 182 above the top surfaces of the vertical fin(s) 151 may be removed, for example, by chemical-mechanical polishing (CMP).

In various embodiments, the conductive second gate fill layer 182 may be a metal, where the metal may be tungsten (W), titanium (Ti), molybdenum (Mo), cobalt (Co), or a combination thereof. The second gate fill layer 182 may be the same material or a different material than the first gate fill layer 181.

In one or more embodiments, a second work function layer 192 may be formed between the second gate dielectric layer 172 and the second gate fill layer 182. A second work function layer 192 may be deposited over the second gate dielectric layer 172. The second work function layer 192 may form part of the second gate structure, where the gate structure may be on at least a portion of a vertical fin 151. The second work function layer 192 may be the same material or a different material than the first work function layer 191.

In various embodiments, a second work function layer 192 may be formed on the second gate dielectric layer 172 by a blanket deposition, for example, CVD, and etched back.

In various embodiments, the second work function layer 192 may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof. The second work function layer 192 may be the same material or a different material than the first work function layer 191.

In various embodiments, the second work function layer 192 may have a thickness in the range of about 3 nm to about 11 nm, or may have a thickness in the range of about 5 nm to about 8 nm.

In one or more embodiments, the channel of a vertical finFET is configured as a tube of semiconductor material having a wall thickness with a first gate outside and adjacent to the perimeter of the tube and a second gate within the tube.

Figure 13:
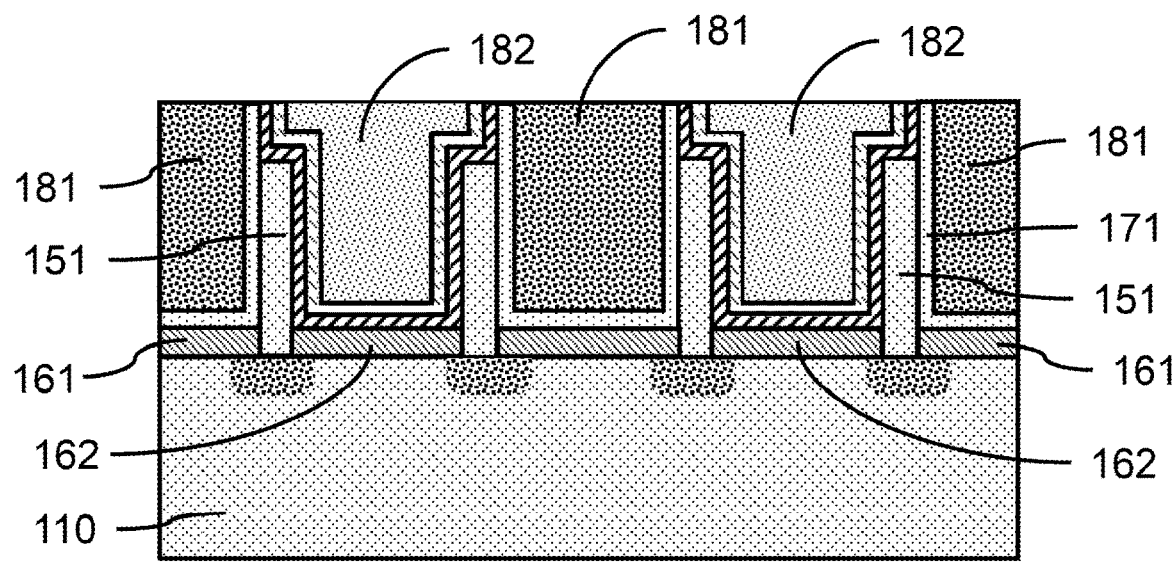
FIG. 13 is a cross-sectional side view of a gate fill layer and a gate dielectric layer on the inner walls of the tubular vertical fins after planarization, in accordance with an exemplary embodiment.

FIG. 13 is a cross-sectional side view of a gate fill layer and a gate dielectric layer on the inner walls of the tubular vertical fins after planarization, in accordance with an exemplary embodiment.

In one or more embodiments, a portion of the second gate fill layer 182, second gate dielectric layer 172, and/or second work function layer 192 may be removed to reduce the height of the second gate fill layer 182, second gate dielectric layer 172, and/or second work function layer 192. In various embodiments, the second gate fill layer 182, second gate dielectric layer 172, and/or second work function layer 192 may be removed by a chemical-mechanical polishing (CMP) or etch-back. The height may be reduced to approximately the top surface of the first gate fill layer 181.

Figure 14:
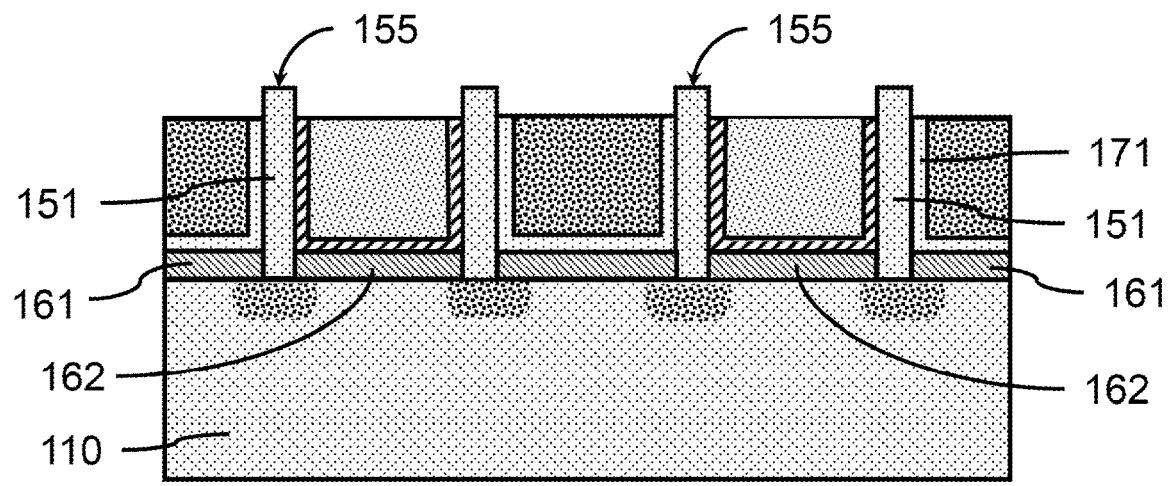
FIG. 14 is a cross-sectional side view of a first and second gate fill layers and gate dielectric layers with a reduced height, in accordance with an exemplary embodiment.

FIG. 14 is a cross-sectional side view of a first and second gate fill layers and gate dielectric layers with a reduced height, in accordance with an exemplary embodiment.

In one or more embodiments, the heights of the first gate fill layer 181, second gate fill layer 182, first gate dielectric layer 171, second gate dielectric layer 172, and/or first and second work function layers 191, 192 may be reduced to below the top surface(s) 155 of the tubular vertical fin(s) 151. The heights of the first gate fill layer 181, second gate fill layer 182, first gate dielectric layer 171, second gate dielectric layer 172, and/or first and second work function layers 191, 192 may be reduced by an amount sufficient to provide space for the formation of a top spacer on the first and second gate structures, while leaving a portion of the vertical fin(s) 151 exposed for formation of a top source/drain.

Figure 15:
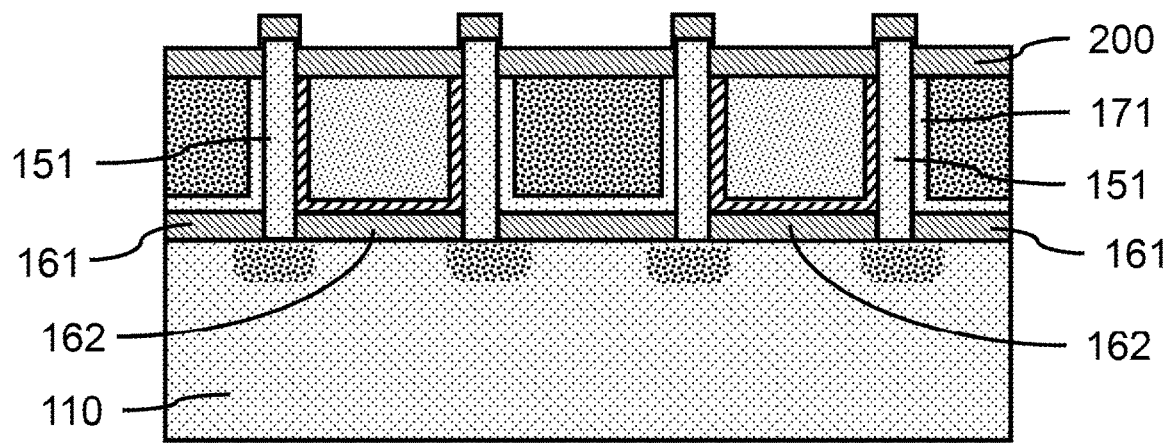
FIG. 15 is a cross-sectional side view of a top spacer formed on the first and second gate structures, in accordance with an exemplary embodiment.

FIG. 15 is a cross-sectional side view of a top spacer formed on the first and second gate structures, in accordance with an exemplary embodiment.

In one or more embodiments, a top spacer layer may be formed on the exposed surfaces of the first gate fill layer 181, second gate fill layer 182, first gate dielectric layer 171, second gate dielectric layer 172, and/or first and second work function layers 191, 192, as well as on the top surface(s) 155 of the tubular vertical fin(s) 151.

The first gate fill layer 181, second gate fill layer 182, first gate dielectric layer 171, second gate dielectric layer 172, and/or first and second work function layers 191, 192, may be removed (e.g., by RIE) until the top surface of the first gate fill layer 181 and second gate fill layer 182 is below the top surface(s) 155 of the tubular vertical fin(s) 151 by an intended thickness of the top spacers 200. Top spacer(s) 200 may be formed on the exposed surfaces of the first gate fill layer 181, second gate fill layer 182, first gate dielectric layer 171, second gate dielectric layer 172, and/or first and second work function layers 191, 192, for example, by CVD, PVD, ALD, GCIB, or a combination thereof. The top spacers 200 may provide electrical isolation of the gate structures from a top source/drain.

In various embodiments, the top spacers 200 may be, for example, silicon oxide (SiO), silicon nitride (SiN), silicon boron carbonitride (SiBCN), silicon oxycarbide (SiOC), etc.

Figure 16:
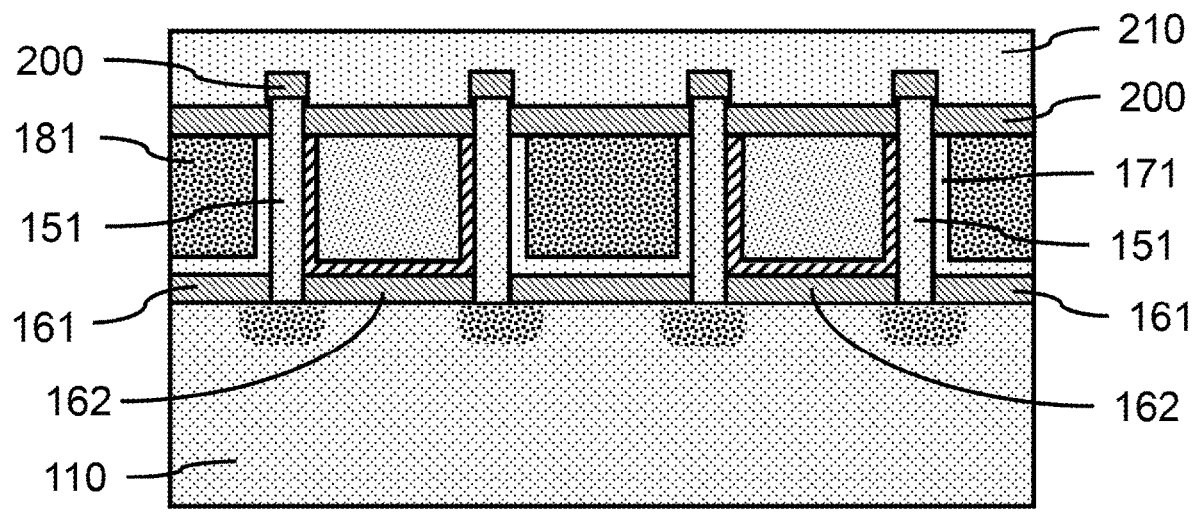
FIG. 16 is a cross-sectional side view of a capping layer over the top spacers on the first and second gate structures, in accordance with an exemplary embodiment.

FIG. 16 is a cross-sectional side view of a capping layer over the top spacers on the first and second gate structures, in accordance with an exemplary embodiment.

In one or more embodiments, a capping layer 210 may be formed on the top spacers 200, where the capping layer may be a silicon nitride (SiN) or low-K dielectric material, for example, fluorine doped SiO, carbon doped SiO, porous SiO, or combinations thereof, where the capping layer may be formed by processes known in the art.

In one or more embodiments, the capping layer may be blanket deposited over the top spacers 200 and vertical fins 151. The capping layer 210 may extend above the tops of the top spacers 200 and vertical fins 151.

Figure 17:
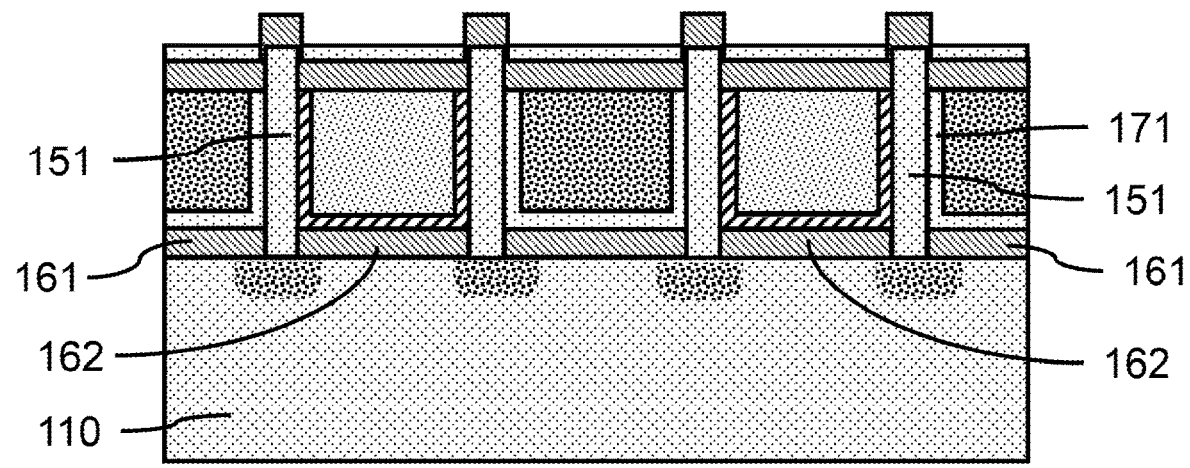
FIG. 17 is a cross-sectional side view of a capping layer on the top spacers after etching back, in accordance with an exemplary embodiment.

FIG. 17 is a cross-sectional side view of a capping layer on the top spacers after etching back, in accordance with an exemplary embodiment.

In one or more embodiments, the height of the capping layer may be reduced by a CMP. The height of the capping layer may be reduced to the top surface of the capping layer 210 on the vertical fins 151.

In various embodiments, the capping layer 210 may be selectively etched back to expose at least a portion of the top spacers 200 on the top surfaces 155 of the vertical fin(s) 151. The capping layer may be selectively etched back by a directional reactive ion etch (RIE) or a selective wet etch. The capping layer 210 may be selectively etched back to the level of the top surfaces 155 of the vertical fin(s) 151.

Figure 18:
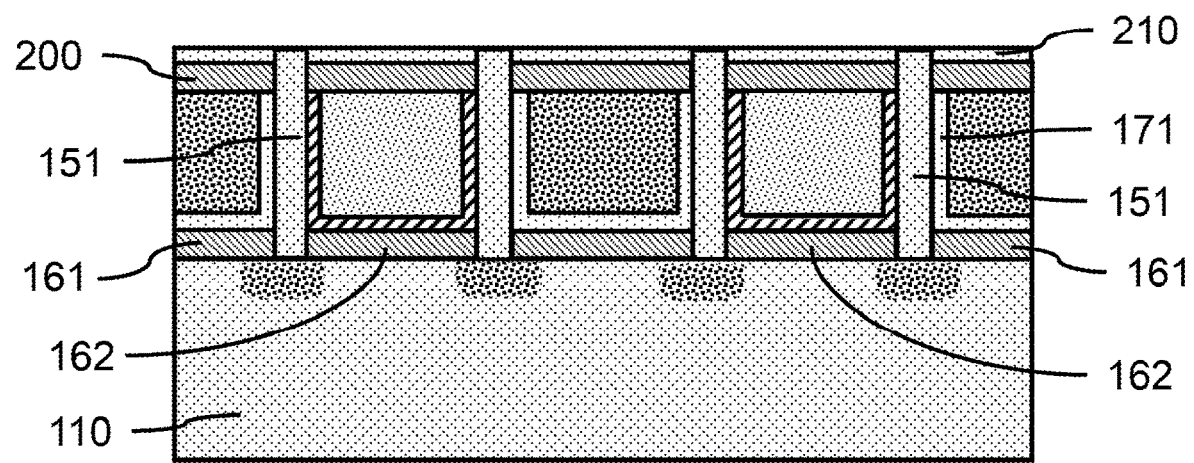
FIG. 18 is a cross-sectional side view of a capping layer on the top spacers after removal of the top spacers from the top surfaces of the vertical fins, in accordance with an exemplary embodiment.

FIG. 18 is a cross-sectional side view of a capping layer on the top spacers after removal of the top spacers from the top surfaces of the vertical fins, in accordance with an exemplary embodiment.

In one or more embodiments, the portion of the top spacers 200 formed on the top surfaces 155 of the vertical fin(s) 151 may be removed to expose the top surfaces 155 of the vertical fin(s) 151. The portion of the top spacers 200 formed on the top surfaces 155 may be removed by CMP, a selective wet etch, selective RIE, or a combination thereof, where the capping layer 210 remaining on the top spacers 200 between the vertical fins 151 can act as an etch stop layer and/or a protective layer during removal of the portion of the top spacers 200. The top surfaces 155 of the vertical fin(s) 151 may be exposed after removal of the top spacers 200.

Figure 19:
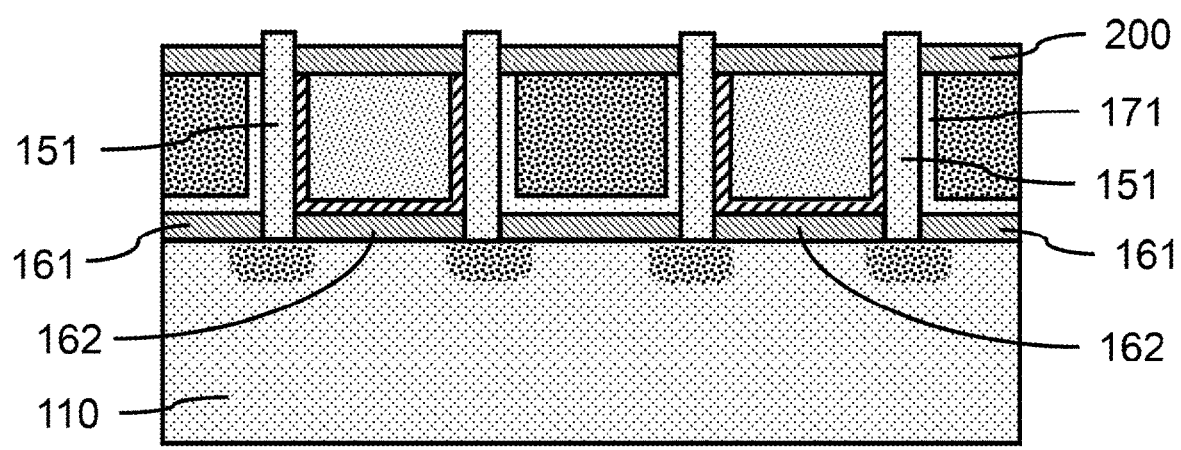
FIG. 19 is a cross-sectional side view of an exposed surface of the top spacers after removal of the capping layer, in accordance with an exemplary embodiment.

FIG. 19 is a cross-sectional side view of an exposed surface of the top spacers after removal of the capping layer, in accordance with an exemplary embodiment.

In one or more embodiments, the capping layer 210 remaining on the top spacers 200 between the vertical fins 151 may be selectively removed to expose the top spacers 200. In various embodiments, the capping layer may be adjacent to and cover a portion of the sidewall(s) of the vertical fins 151. When the capping layer is removed, a portion of the sidewall(s) of the vertical fins 151 may also be exposed. The portion of the capping layer 210 may be removed by a selective wet etch, selective RIE, or a combination thereof.

Figure 20:
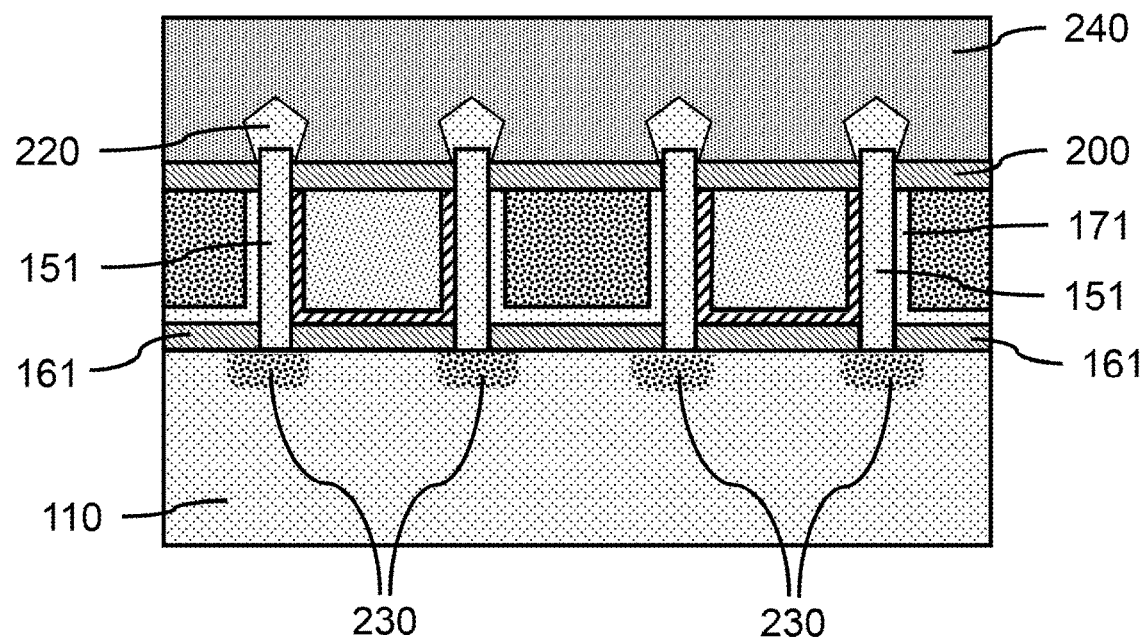
FIG. 20 is a cross-sectional side view of a top source/drain formed on the exposed portion of the vertical fins, and an interlayer dielectric on the top source/drains, in accordance with an exemplary embodiment.

FIG. 20 is a cross-sectional side view of a top source/drain formed on the exposed portion of the vertical fins, and an interlayer dielectric on the top source/drains, in accordance with an exemplary embodiment.

In one or more embodiments, a top source/drain 220 may be formed on the sidewalls 153, 157 and/or top surfaces 155 of the vertical fin(s) 151. The top source/drain(s) 220 may be formed by epitaxially growth on the exposed surfaces of the vertical fin(s) 151, where the top source/drains 220 may have the same crystal structure and orientation as the vertical fin(s) 151.

In various embodiments, the top source/drain(s) 220 may be doped in-situ or ex-situ, where the doping may be p-type doping or n-type doping to form an n-type vertical FET (NFET) or a p-type vertical FET (PFET). The channel may be suitably doped to affect the carrier concentrations and to form an n-type vertical finFET or a p-type vertical finFET in relation to the top source/drains 220 and doped region(s) 230 forming bottom source drain(s) of the vertical finFETs.

In various embodiments, the top source/drain 220 may be the same material as the vertical fin 151 on which the top source/drain 220 is formed. In various embodiments, the source and drain may be interchanged, where the doped regions 230 can form a drain and the epitaxially formed doped material at the top of the vertical fin 151 may be the source.

In one or more embodiments, an interlayer dielectric 240 may be formed on the top spacer(s) 200 and the top source/drain 220, where the interlayer dielectric 240 may be blanket deposited on the exposed top surfaces of the top spacers 200 and top source/drain(s) 220. The height of the interlayer dielectric 240 may then be reduced, for example, by CMP.

In various embodiments, the interlayer dielectric 240 may be, for example, silicon oxide (SiO), silicon nitride (SiN), silicon boron carbonitride (SiBCN), silicon oxycarbide (SiOC), etc. The interlayer dielectric 240 may be the same or different material as the top spacer(s) 200. In one or more embodiments, an interlayer dielectric 240 may be a low-K dielectric material, for example, fluorine doped SiO, carbon doped SiO, porous SiO, or combinations thereof. The interlayer dielectric 240 may be an insulating material that electrically insulates electrical contacts formed to the gate structures, and/or source/drains.

Figure 21:
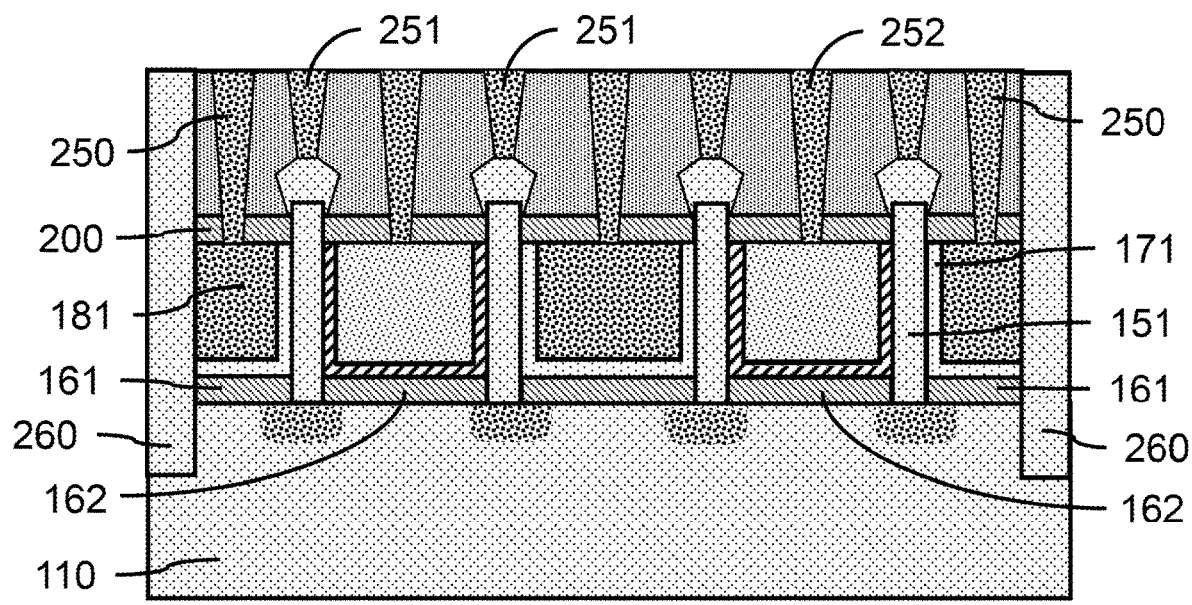
FIG. 21 is a cross-sectional side view of electrical contacts formed in the interlayer dielectric to the gate structure and top source/drains, in accordance with an exemplary embodiment.

FIG. 21 is a cross-sectional side view of electrical contacts formed in interlayer dielectric to the gate structure and top source/drains, in accordance with an exemplary embodiment.

In one or more embodiments, interconnect vias may be formed in the interlayer dielectric 240 and filled with a conductive material (e.g., tungsten. copper, titanium, molybdenum, aluminum, or combinations thereof) to form electrical contacts 250, 251, 252, where the electrical contacts may be first gate structure contacts 250, top source/drain contacts 251, or second gate structure contacts 252. The interconnect vias and electrical contacts 250, 252 may extend through the top spacer(s) 200 to the first gate fill layer 181 or second gate fill layer 182, respectively.

In one or more embodiments, a trench may be cut into the interlayer dielectric 240 and first gate structure, and down into the substrate 110. The trench may be filled with an insulating dielectric material to form an isolation region 260 to electrically isolate one or more tubular vertical fin(s) 151 into a vertical finFET device.

Figure 22:
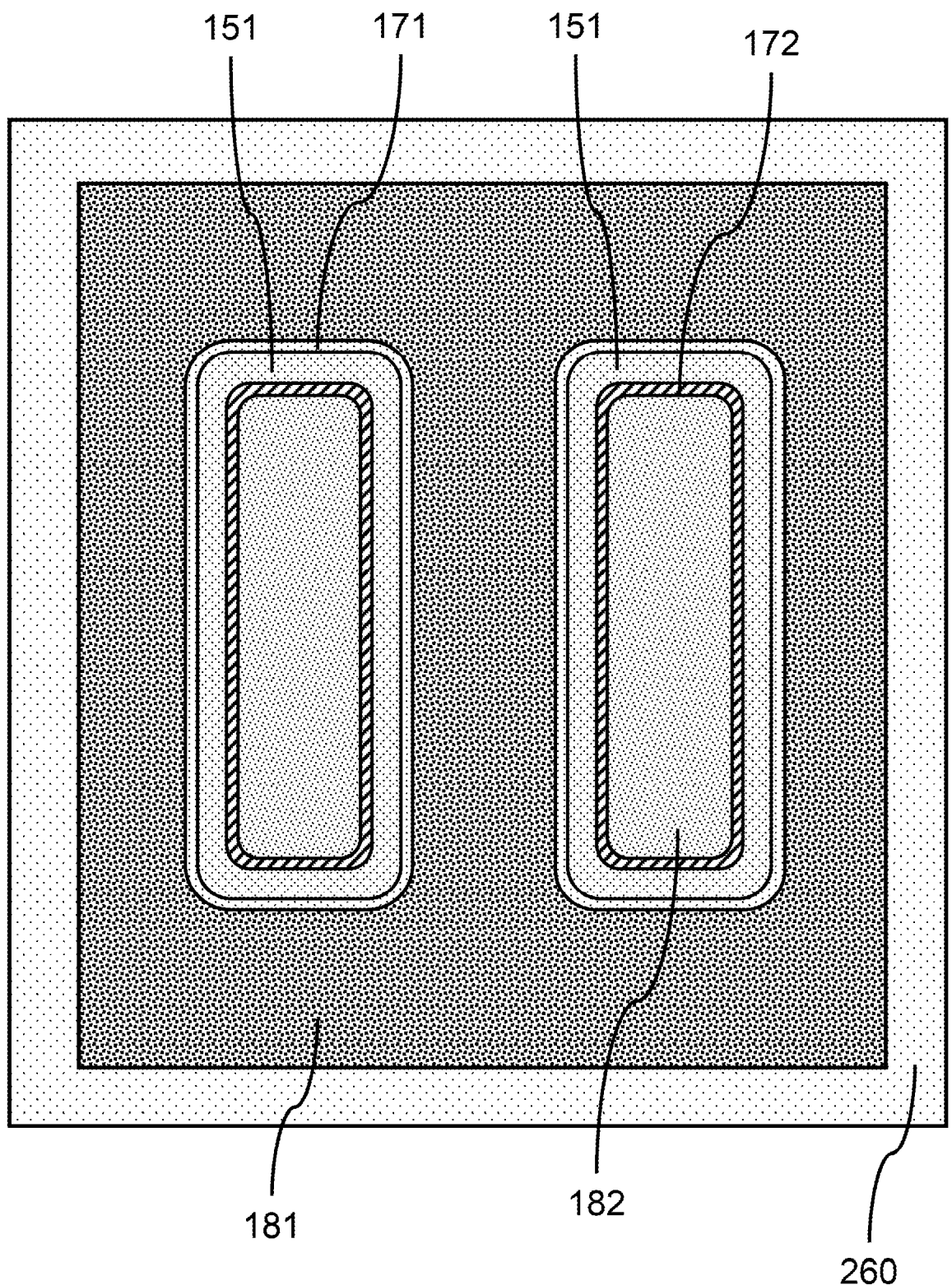
FIG. 22 is a cross-sectional top view of FIG. 21 showing two tubular vertical fins surrounded by the same first gate structure and an isolation region to form a vertical finFET, in accordance with an exemplary embodiment.

FIG. 22 is a cross-sectional top view of FIG. 21 showing two tubular vertical fins surrounded by the same first gate structure and an isolation region to form a vertical finFET, in accordance with an exemplary embodiment.

In one or more embodiments, an isolation region 260 may be formed around one or more tubular vertical fin(s) 151 to electrically isolate the one or more tubular vertical fin(s) 151 and gate structures into a single vertical finFET device. The first gate fill layer 181 may surround the first gate dielectric layer 171 forming a first gate structure on the outer wall of the vertical fin 151, and the isolation region 260 may surround the first gate structure. The vertical fin 151 may surround the second gate dielectric layer 172 and second gate fill layer 182 forming a second gate structure on the inner wall of each vertical fin 151, where the first gate structure, tubular vertical fin 151, and second gate structure are concentric device components. The first gate structure and second gate structure may, thereby, be physically separate and independent.

In various embodiments, two or more second gate structures on the inner wall of each vertical fin 151 forming the same vertical finFET device may be electrically coupled, so the two or more second gate structures operate in tandem. The first gate structure and second gate structure may not be electrically coupled together, so the first and second gate structures operate independently, or the first and second gate structures may be electrically coupled together to operate in tandem.

Figure 23:
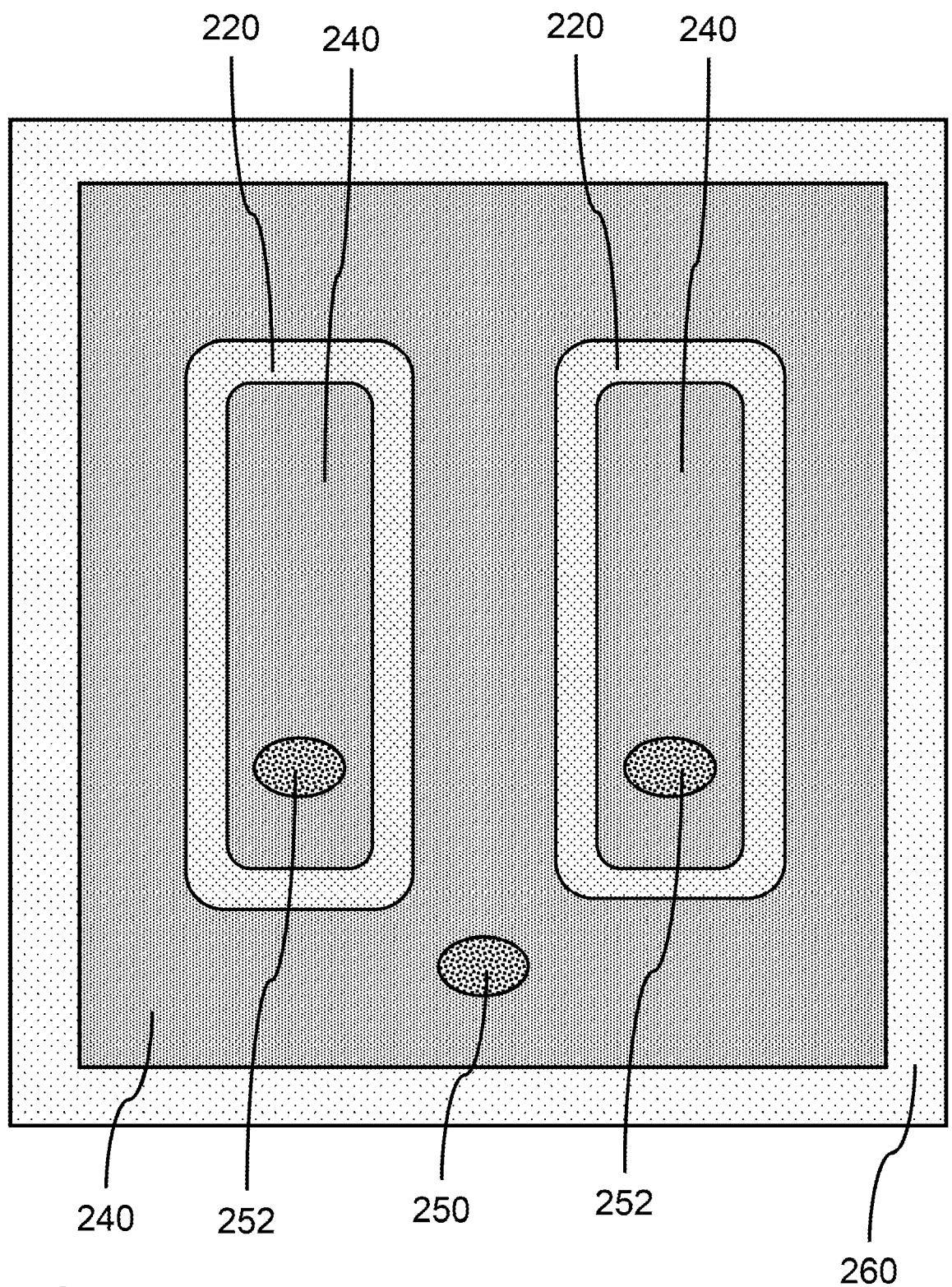
FIG. 23 is a cross-sectional top view of FIG. 21 showing the interlayer dielectric, two top source/drains, and electrical contacts forming a vertical finFET, in accordance with an exemplary embodiment.

FIG. 23 is a cross-sectional top view of FIG. 21 showing the interlayer dielectric, two top source/drains, and electrical contacts forming a vertical finFET, in accordance with an exemplary embodiment.

In one or more embodiments, isolation region 260 may surround a portion of the interlayer dielectric 240 and top source/drain(s) 220 of a vertical finFET device. One or more second gate structure contacts 252 may be formed in an interconnect via through the interlayer dielectric 240 to a second gate fill layer 182 to electrically couple the second gate structure to an external electrical contact. One or more first gate structure contacts 250 may be formed in an interconnect via through the interlayer dielectric 240 to a first gate fill layer 181 to electrically couple the first gate structure to an external electrical contact. A top source/drain contact 251 may be formed in an interconnect via through the interlayer dielectric 240 to each top source/drain 220 to electrically couple the top source/drain(s) to an external electrical contact. In various embodiments, the first gate structure may be used as a channel control gate, and the second gate structure may be used for back bias (e.g. threshold voltage adjustment).

Figure 24:
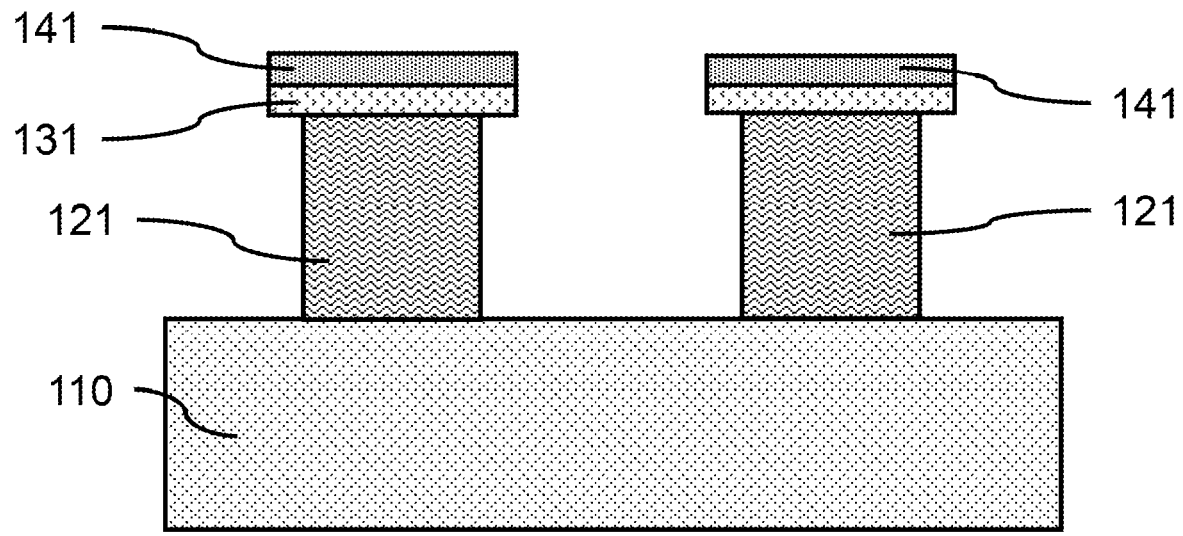
FIG. 24 is a cross-sectional side view of a hardmask slab and liner plate on each of a plurality of laterally reduced sacrificial mandrels on a substrate similar to FIG. 3, in accordance with another exemplary embodiment.

FIG. 24 is a cross-sectional side view of a hardmask slab and liner plate on each of a plurality of laterally reduced sacrificial mandrels on a substrate similar to FIG. 3, in accordance with another exemplary embodiment.

Figure 25:
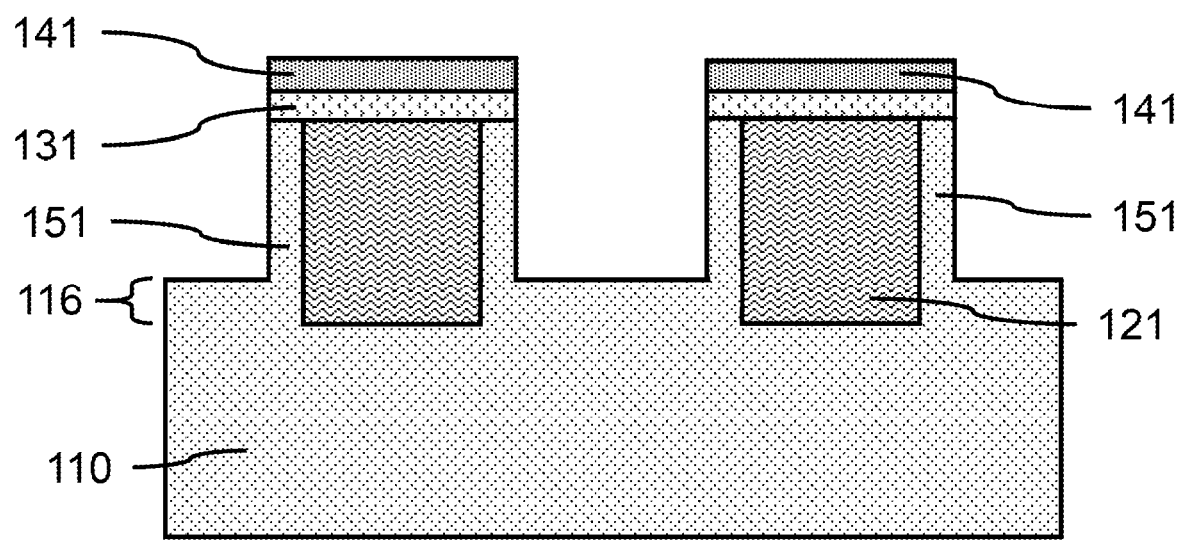
FIG. 25 is a cross-sectional side view of a vertical fin epitaxially grown on each of the sacrificial mandrels and epitaxially grown substrate layer, in accordance with another exemplary embodiment.

FIG. 25 is a cross-sectional side view of a vertical fin epitaxially grown on each of the sacrificial mandrels and epitaxially grown substrate layer, in accordance with another exemplary embodiment.

In one or more embodiments, the formation of vertical fin(s) 151 may also include forming additional material 116 on the surface 115 of the substrate 110, where the material may be the same material as the vertical fin(s). In various embodiments, the formation of vertical fin(s) 151 may be altered to also epitaxially grow additional substrate material 116 on the surface 115 of the substrate 110, while epitaxially growing the vertical fin(s) 151 on the sacrificial mandrel(s) 121. The thickness of the substrate may be increased in the areas between the sacrificial mandrels 121 to produce a relatively deeper second gate structure within the tubular vertical fin 151, and a relatively higher first gate structure outside the vertical fin 151. The additional substrate material 116 may be grown on the substrate surface 115 by preparing the surface for epitaxial growth and leaving the prepared surface exposed during formation of the vertical fin(s) 151.

In various embodiments, the distance from the top surface 155 of the tubular vertical fin to the substrate surface 115 is greater within the tubular vertical fin than the distance from the top surface 155 of the tubular vertical fin 151 to the substrate surface 115 outside the same tubular vertical fin 151, such that the heights of the walls on the inside and outside of the tubular vertical fin 151 are different to provide an asymmetric gate structure.

In various embodiments, the additional substrate material 116 may have a thickness, Tad, in the range of about 6 nm to about 20 nm, or in the range of about 8 nm to about 15 nm, or in the range of about 10 nm to about 12 nm. The additional substrate material 116 may be added to the portion of the substrate 110 outside of the tubular vertical fin 151, where the additional thickness may be the same thickness as the vertical fin 151 formed during the epitaxial growth process.

Figure 26:
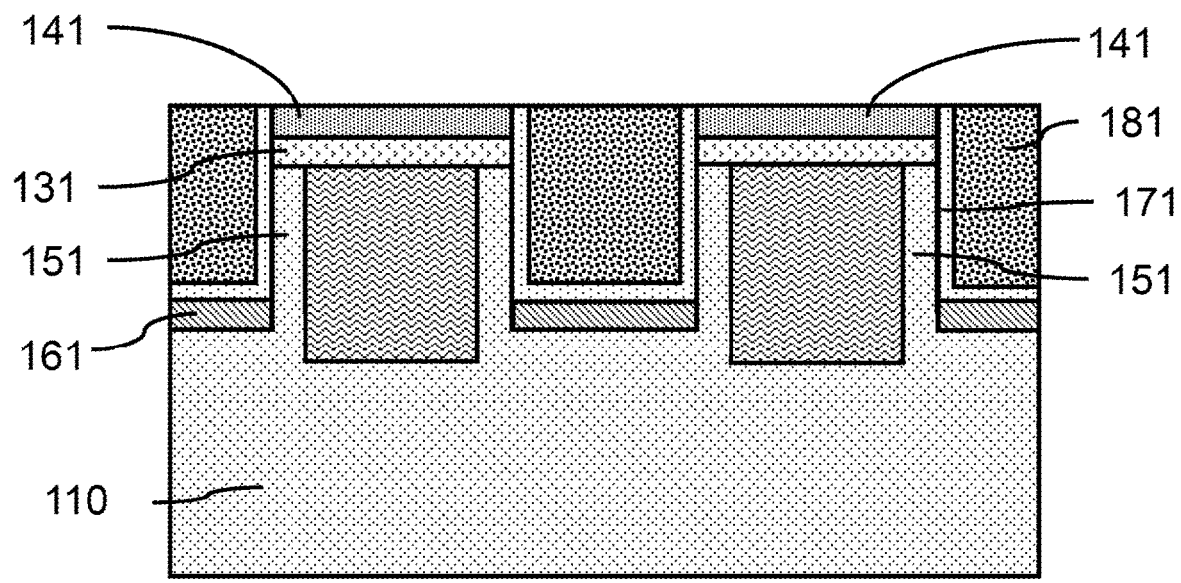
FIG. 26 is a cross-sectional side view of a gate structure and bottom spacer on the additional substrate material around a plurality of vertical fins, in accordance with another exemplary embodiment.

FIG. 26 is a cross-sectional side view of a gate structure and bottom spacer on the additional substrate material around a plurality of vertical fins, in accordance with another exemplary embodiment.

A first bottom spacer 161 and first gate structure including a first gate dielectric layer 171 and first gate fill layer 181 may be formed on the substrate area having the additional substrate material 116, such that the first gate structure is raised in reference to the level of the substrate surface within the tubular vertical fin 151.

Figure 27:
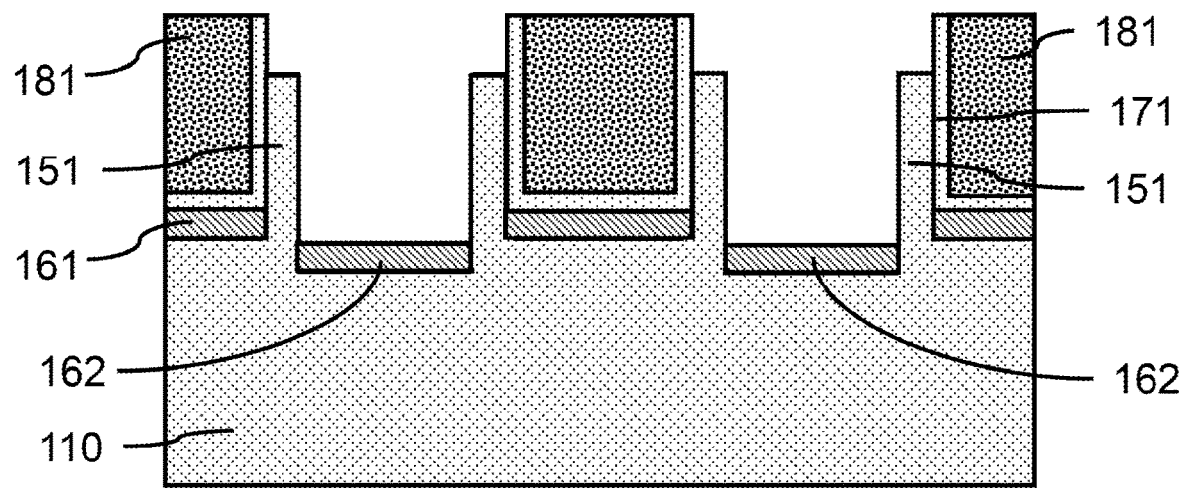
FIG. 27 is a cross-sectional side view of a bottom spacer formed within the tubular vertical fins after removal of the sacrificial mandrels and hardmask slab(s), in accordance with another exemplary embodiment.

FIG. 27 is a cross-sectional side view of a bottom spacer formed within the tubular vertical fins after removal of the sacrificial mandrels and hardmask slab(s), in accordance with another exemplary embodiment.

In one or more embodiments, the hardmask slab(s) 141 and liner plate(s) 131 may be removed to expose sacrificial mandrel(s) 121. The sacrificial mandrel(s) 121 may then be removed to expose the substrate surface within the tubular vertical fin(s) 151, and a second bottom spacer 162 may be formed on the substrate surface 115 within the tubular vertical fin(s) 151, as described for FIGS. 9 and 10. In various embodiments, the second bottom spacer 162 may be below the level of the first bottom spacer 161.

Figure 28:
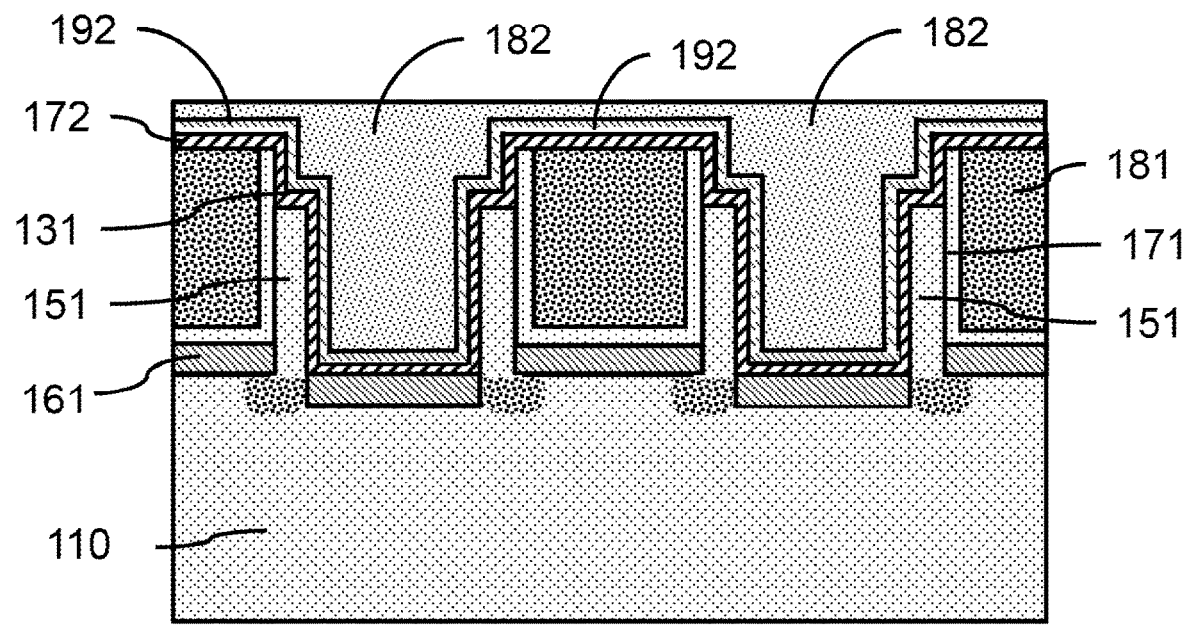
FIG. 28 is a cross-sectional side view of a gate dielectric layer on the second bottom spacer and inner walls of the tubular vertical fins and a gate fill layer to form a second gate structure, in accordance with another exemplary embodiment.

FIG. 28 is a cross-sectional side view of a gate dielectric layer on the second bottom spacer and inner walls of the tubular vertical fins and a gate fill layer to form a second gate structure, in accordance with another exemplary embodiment.

In one or more embodiments, a second gate structure may include a second gate fill layer 182. In one or more embodiments, a second gate fill layer 182 may be formed on the second bottom spacer 162 and/or second gate dielectric layer 172, where the second gate fill layer 182 may be a conductive material that forms part of a gate electrode on a vertical fin 151. In various embodiments, the gate fill layer 182 may be formed on the bottom spacer 162 and/or a work function layer 192, where the work function layer 192 is formed between the second gate dielectric layer and the second gate fill layer. The second gate fill layer 182 may be formed by a blanket deposition that fills the spaces within tubular vertical fin(s) 151, for example, by ALD, CVD, PVD, or a combination thereof. The second gate fill layer 182 may extend above the tops surfaces of the vertical fin(s) 151. The portion of gate fill layer 182 above the top surfaces of the vertical fin(s) 151 may be removed, for example, by chemical-mechanical polishing (CMP). In various embodiments, the second gate dielectric layer and the second gate fill layer may be below the level of the first gate dielectric layer and the first gate fill layer to provide a first gate structure and a second gate structure with asymmetric dimensions.

In various embodiments, the conductive second gate fill layer 182 may be a metal, where the metal may be tungsten (W), titanium (Ti), molybdenum (Mo), cobalt (Co), or a combination thereof. The second gate fill layer 182 may be the same material or a different material than the first gate fill layer 181.

Figure 29:
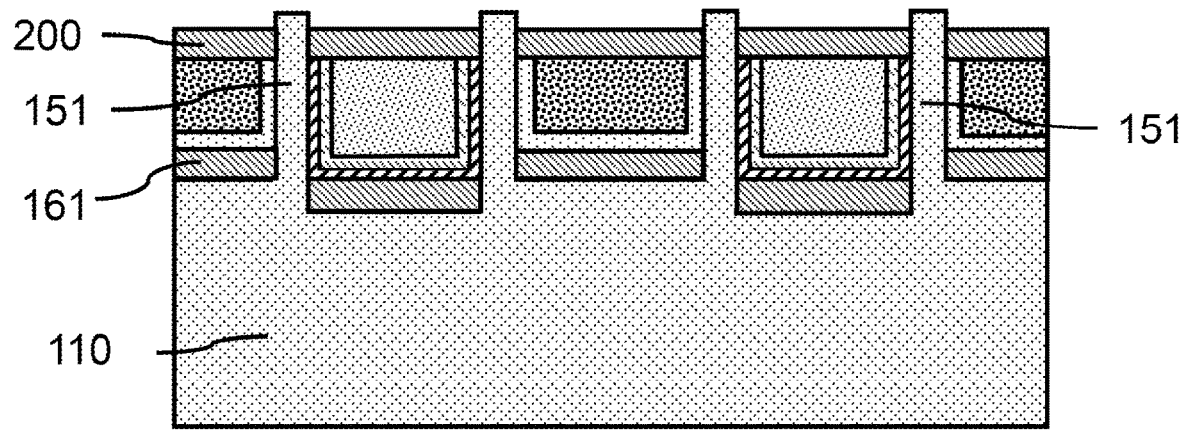
FIG. 29 is a cross-sectional side view of an exposed surface of the top spacers after formation of the second gate structure, in accordance with another exemplary embodiment.

FIG. 29 is a cross-sectional side view of an exposed surface of the top spacers after formation of the second gate structure, in accordance with another exemplary embodiment.

In various embodiments, the second gate structure may be adjusted and top spacer layers 200 formed as described for FIGS. 13 to 19.

An interlayer dielectric 240 and interconnect vias may be formed and filled with a conductive material (e.g., tungsten. copper, titanium, aluminum, or combinations thereof) to form electrical contacts, where the electrical contacts may be first gate structure contacts, top source/drain contacts, or second gate structure contacts, as described for FIGS. 20 and 21, to form the vertical finFET devices described in FIGS. 22 and 23, with asymmetric first and second gate structures.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Spatially relative terms, such as "beneath," "below," "lower," "above," "upper," and the like, may be used herein for ease of description to describe one element's or feature's relationship to anotherelement(s) or feature(s) as illustrated in the FIGs. It will be understood that the spatially relative terms are intended to encompass different orientations of the device in use or operation in addition to the orientation depicted in the FIGs. For example, if the device in the FIGS. is turned over, elements described as "below" or "beneath" other elements or features would then be oriented "above" the other elements or features. Thus, the term "below" encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers or one or more intervening layers may also be present.

It will be understood that, although the terms first, second, etc. may be used herein to describe various elements, these elements should not be limited by these terms. These terms are only used to distinguish one element from another element. Thus, a first element could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (vertical finFET) with two concentric gate structures, comprising:
    forming an outer gate structure around an outer wall of a tubular vertical fin, wherein the tubular vertical fin is directly in contact with a semiconductor substrate; and
    forming an inner gate structure on an inner bottom spacer within an inner wall of the tubular vertical fin.

2. The method of claim 1, further comprising forming an outer bottom spacer around an outer wall of a tubular vertical fin between the outer gate structure and the semiconductor substrate.

3. The method of claim 2, wherein the outer gate structure includes an outer gate dielectric layer formed on the outer bottom spacer and the outer wall of the tubular vertical fin.

4. The method of claim 3, wherein the outer gate structure includes an outer work function layer deposited over the outer gate dielectric layer.

5. The method of claim 4, wherein the inner gate structure includes an inner gate dielectric layer formed on the inner bottom spacer and the inner wall of the tubular vertical fin.

6. The method of claim 5, wherein the inner gate structure includes an inner work function layer deposited over the inner gate dielectric layer.

7. The method of claim 6, wherein the inner work function layer and the outer work function layer are different materials.

8. The method of claim 6, wherein the outer gate structure includes an outer gate fill layer formed on the outer work function layer, and the inner gate structure includes an inner gate fill layer formed on the inner work function layer.

9. The method of claim 8, wherein the material of the outer gate fill layer and the material of the inner gate fill layer are selected from the group consisting of tungsten (W), titanium (Ti), molybdenum (Mo), cobalt (Co), and combinations thereof.

10. The method of claim 9, wherein the material of the first gate fill layer is different from the material of the second gate fill layer.

11. A method of forming a vertical fin field effect transistor (vertical finFET) with two concentric gate structures, comprising:
   forming a doped region in a substrate below a tubular vertical fin;
   forming an outer gate structure on an outer bottom spacer on the substrate around an outer wall of the tubular vertical fin, wherein the outer bottom spacer provides electrical isolation between the doped region and the outer gate structure; and
   forming an inner gate structure on an inner bottom spacer within an inner wall of the tubular vertical fin, wherein the inner bottom spacer provides electrical isolation between the doped region and the inner gate structure.

12. The method of claim 11, further comprising an inner top spacer on the inner gate structure.

13. The method of claim 11, further comprising an outer top spacer on the outer gate structure.

14. The method of claim 11, wherein the material of the inner top spacer and the material of the outer top spacer are selected from the group consisting of silicon oxide (SiO), silicon nitride (SiN), silicon boron carbonitride (SiBCN), and silicon oxycarbide (SiOC).

15. A vertical fin field effect transistor (vertical finFET) with a concentric gate structure, comprising:
   a tubular vertical fin directly in contact with a doped region in a semiconductor substrate;
   an outer bottom spacer around an outer wall of the tubular vertical fin;
   an outer gate structure on the outer bottom spacer and the outer wall of the tubular vertical fin;
   an inner bottom spacer within an inner wall of the tubular vertical fin; and
   an inner gate structure on the inner bottom spacer and the inner wall of the tubular vertical fin.

16. The vertical finFET of claim 15, wherein the inner gate structure and the outer gate structure are not electrically coupled together.

17. The vertical finFET of claim 15, further comprising a top source drain on at least a portion of the top surface of the tubular vertical fin.

18. The vertical finFET of claim 17, wherein the distance from the top surface of the tubular vertical fin to the substrate surface is greater within the tubular vertical fin than the distance from the top surface of the tubular vertical fin to the substrate surface outside the tubular vertical fin.

19. The vertical finFET of claim 15, wherein the heights of the first gate structure and the second gate structure are unequal.

20. The vertical finFET of claim 15, wherein the first gate structure includes a first gate dielectric layer, and the second gate structure includes a second gate dielectric layer, wherein the second gate dielectric layer is a different material than the first gate dielectric layer.

* * * * *